United States Patent [19]
Muraki et al.

[11] Patent Number: 5,864,142
[45] Date of Patent: Jan. 26, 1999

[54] ELECTRON BEAM EXPOSURE APPARATUS AND METHOD OF CONTROLLING SAME

[75] Inventors: Masato Muraki, Inagi; Susumu Goto, Tama, both of Japan

[73] Assignee: Canon Kabushiki Kaisha, Tokyo, Japan

[21] Appl. No.: 873,023

[22] Filed: Jun. 11, 1997

[30] Foreign Application Priority Data

Jun. 12, 1996 [JP] Japan ................................ 8-150986

[51] Int. Cl.$^6$ .................................................. H01J 37/304
[52] U.S. Cl. ....................................................... 250/491.1
[58] Field of Search ............................ 250/491.1, 492.2, 250/492.22, 398

[56] References Cited

U.S. PATENT DOCUMENTS

| | | | |
|---|---|---|---|
| 4,130,761 | 12/1978 | Matsuda | 250/492.2 |
| 4,724,328 | 2/1988 | Lischke | 250/492.2 |
| 4,812,662 | 3/1989 | Goto et al. | 250/491.1 |
| 4,980,567 | 12/1990 | Yasuda et al. | 250/398 |
| 5,422,491 | 6/1995 | Sakamoto | 250/491.1 |

*Primary Examiner*—Kiet T. Nguyen
*Attorney, Agent, or Firm*—Fitzpatrick, Cella, Harper & Scinto

[57] ABSTRACT

A beam coordinate system decided by a plurality of beam reference positions and a deflection coordinate system decided by a deflector in a multi-electron beam exposure apparatus are made to coincide in a highly precise fashion and exposure is performed upon rapidly correcting a change in the offset between the two coordinate systems with the passage of time. The apparatus has an adjusting unit for adjusting an XY stage or a deflector based upon a first parameter representing the relationship between the beam coordinate system, which is decided by the plurality of beam reference positions, and the design coordinate system, and a second parameter representing the relationship between the deflection coordinate system, which is decided by the deflector, and the design coordinate system.

36 Claims, 21 Drawing Sheets

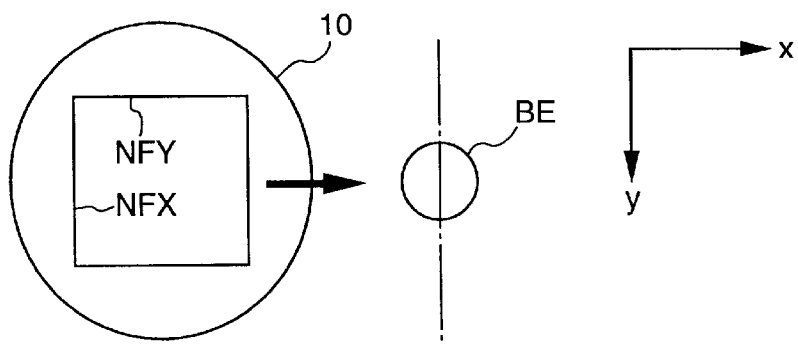
FIG. 6A
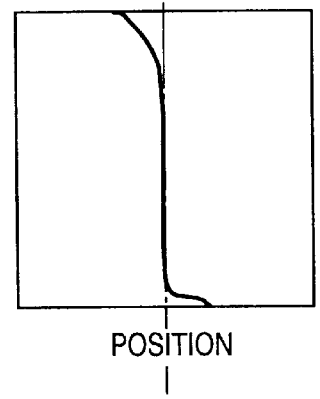
FIG. 6B    AMOUNT OF
           ELECTRONS
                       POSITION
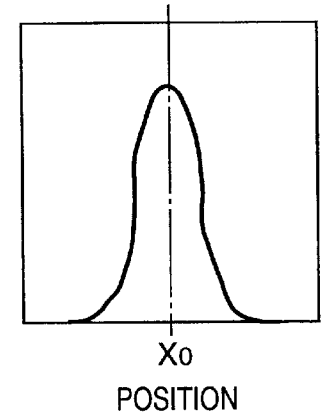
FIG. 6C    AMOUNT OF
           ELECTRONS
                       Xo
                       POSITION

FLOWCHART OF SEMICONDUCTOR DEVICE MANUFACTURE

WAFER PROCESS

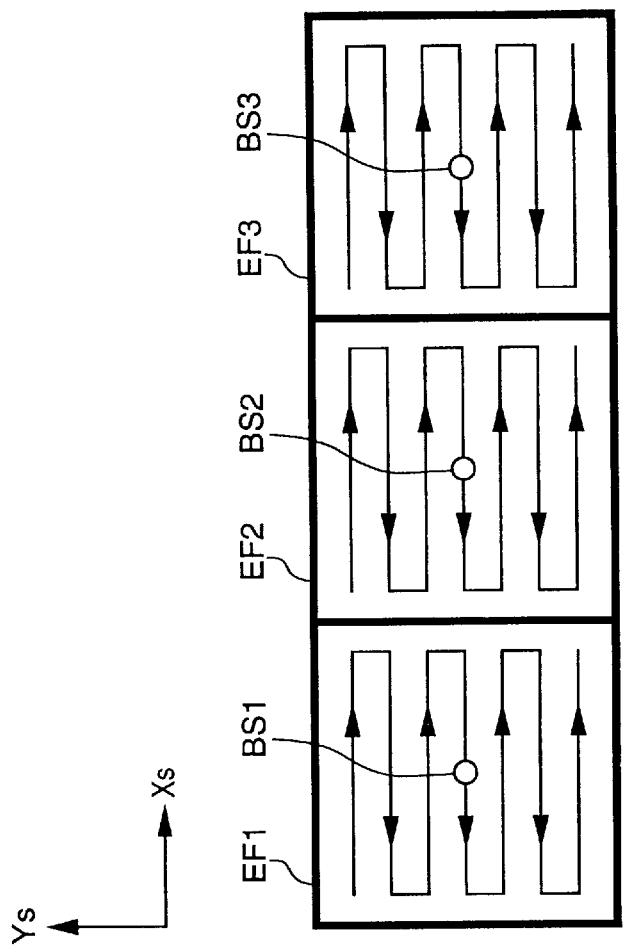

FIG. 17A
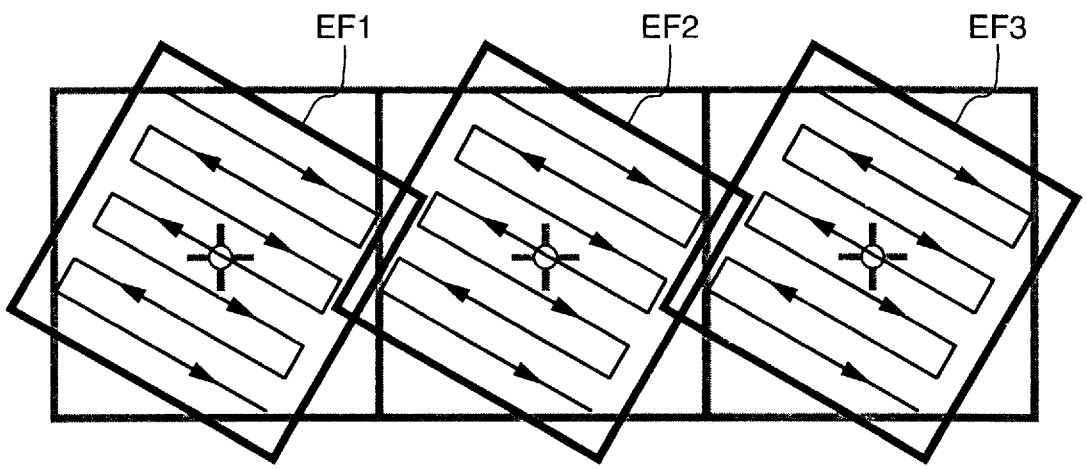
FIG. 17B
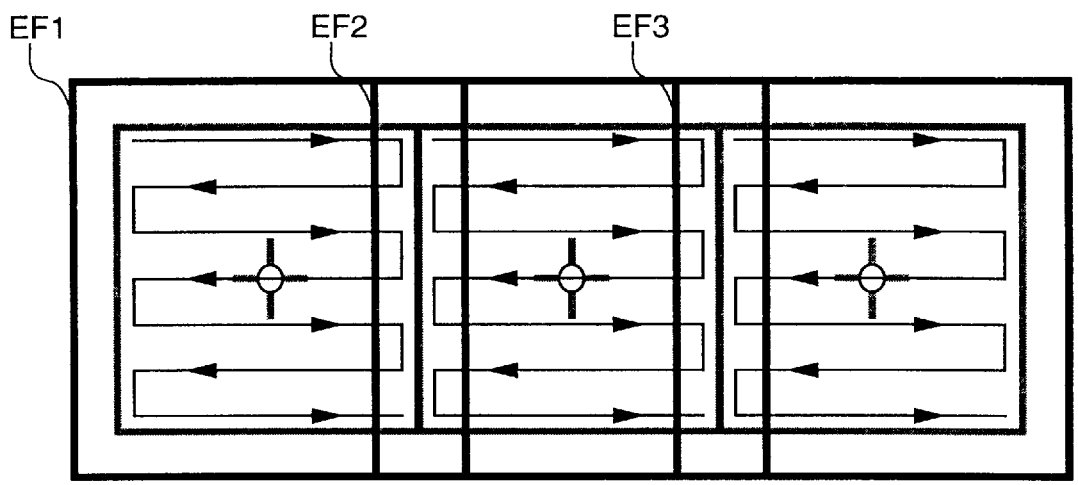
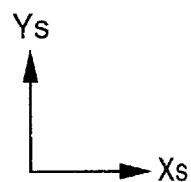

ELECTRON BEAM EXPOSURE APPARATUS AND METHOD OF CONTROLLING SAME

BACKGROUND OF THE INVENTION

This invention relates to an electron beam exposure apparatus and method of controlling the same. More particularly, the invention relates to an electron beam exposure apparatus for drawing a pattern on a wafer directly or on a mask or reticle using a plurality of electron beams, a method of controlling the apparatus, the associated control program and a method of manufacturing a device using this electron beam exposure apparatus.

Examples of electron beam exposure apparatuses include an apparatus of the point beam type which uses a beam in the shape of a spot, an apparatus of the variable rectangular beam type which uses a beam in the shape of a rectangular cross section, and an apparatus of the stencil mask type which uses a beam given a desired cross-sectional shape through use of a stencil mask.

The electron beam exposure apparatus of the point beam type is used exclusively for research and development purposes because of its low throughput. Though the electron beam exposure apparatus of the variable rectangular beam type has a throughput higher than that of the apparatus of the point beam type by one to two orders, many problems remain in terms of throughput when it is attempted to expose a pattern consisting of fine patterns on the order of 0.1 $\mu$m integrated to high density. On the other hand, the electron beam exposure apparatus of the stencil mask type uses a stencil mask in which a plurality of repetitive pattern through-holes are formed at a portion thereof that corresponds to a variable rectangular aperture. As a result, the electron beam exposure apparatus of the stencil mask type is highly advantageous when exposing repetitive patterns. However, in the case of a semiconductor circuit that requires a multiplicity of transfer patterns that will not fit on a single stencil mask, it is necessary to produce a plurality of stencil masks in advance and use them by extracting them one at a time. Since changing masks takes time, a problem that arises is a very low throughput.

An apparatus which solves this problem is a multi-electron beam exposure apparatus which irradiates the surface of a sample with a plurality of electron beams along design coordinates of the surface, scans the plurality of electron beams across the sample surface by deflecting the electron beams along the design coordinates, and turns the plurality of electron beams on and off individually in conformity with the pattern to be drawn, thereby drawing the pattern on the surface. A feature of the multi-electron beam exposure apparatus is that throughput can be improved owing to the ability to draw any pattern without using a stencil mask.

FIG. 15 illustrates the general arrangement of the multi-electron beam exposure apparatus. The apparatus includes electron guns 501a, 501b, 501c whose electron beams can be turned on and off individually, a reduction electron optical system 502 for reducing the diameters of the plurality of electron beams and projecting the beams upon a wafer 503, and a deflector 504 for scanning the plurality of projected electron beams of reduced diameter across the wafer 503.

FIG. 16 illustrates the manner in which the plurality of electron beams are scanned across the surface of the wafer. The white circles in FIG. 16 are beam reference positions (BS1, BS2, BS3) at which the electron beams impinge upon the wafer when they are not deflected by the deflector 504. The beam reference positions are arrayed in a design rectangular coordinate system (Xs, Ys). Each electron beam is scanned in the design rectangular coordinate system (Xs, Ys) using the beam reference position as a reference, thereby scanning exposure fields EF1, EF2, EF3 of the respective electron beams. The wafer is exposed using the contiguous exposure fields of the electron beams.

When a deflection coordinate system (Xd, Yd) decided by the deflector is offset from the design rectangular coordinate system (Xs, Ys), however, the exposure fields of the electron beams come to overlap or separate, rather than remain contiguous, even through the beam coordinate system (Xa, Ya) decided by the plurality of beam reference positions coincides with the design rectangular coordinate system (Xs, Ys). This makes it impossible to draw the desired patterns. FIG. 17A illustrates the exposure fields in a case where the deflection coordinate system has been rotated with respect to the beam coordinate system. FIG. 17B illustrates the exposure fields in a case where the deflection coordinate system has been enlarged with respect to the beam coordinate system.

SUMMARY OF THE INVENTION

An object of the present invention is to establish coincidence between a beam coordinate system and a deflection coordinate system associated with deflecting means, wherein the beam coordinate system is decided by an array of irradiation positions of a plurality of electron beams caused to irradiate a stage under substantially identical conditions by irradiating means which cause the plurality of electron beams to be arrayed on and to irradiate a substrate.

According to the present invention, the foregoing object is attained by providing an electron beam exposure apparatus having irradiating means for causing a plurality of electron beams to be arrayed on and to irradiate a substrate, deflecting means for deflecting the plurality of electron beams, which are caused to irradiate the substrate by the irradiating means, by approximately identical amounts of deviation, and driving means for driving a stage on which the substrate is placed, the apparatus comprising detecting means for detecting irradiation positions of the electron beams which irradiate the stage, first correcting means for establishing coincidence between a design coordinate system and a beam coordinate system, which is decided by the array of the plurality of electron beams caused to irradiate the stage under substantially identical conditions by the irradiating means, based upon a relationship between electron beam irradiation positions detected by the detecting means and design irradiation positions, and second correcting means for establishing coincidence between a deflection coordinate system associated with the deflecting means and the design coordinate system based upon a relationship between the design irradiation positions and the electron beam irradiation positions detected by the detecting means when the electron beams are deflected by the deflecting means.

In a preferred embodiment, the first correcting means corrects a setting for controlling the stage driving means.

In a preferred embodiment, the first correcting means obtains an amount of translation and an amount of rotation between the beam coordinate system and the design coordinate system that are necessary to establish coincidence between the beam coordinate system and the design coordinate system, and corrects the setting for controlling the stage driving means.

In a preferred embodiment, the irradiating means has a plurality of electron beam sources and an electron optical system for projecting a plurality of electron beams, which have been emitted by respective ones of the electron beam sources, onto the substrate, the first correcting means obtaining an amount of linear expansion and contraction necessary to establish coincidence between the beam coordinate system and the design coordinate system, and sets a magnification of the electron optical system based upon the amount.

In a preferred embodiment, the irradiating means further has a rotating lens for producing rotational aberration in the plurality of electron beams which irradiate the substrate from the plurality of electron beam sources, the first correcting means obtaining an amount of rotation between the beam coordinate system and the design coordinate system that is necessary to establish coincidence between the beam coordinate system and the design coordinate system, and correcting a setting, which is for controlling the rotating lens, based upon the amount of rotation.

In a preferred embodiment, the second correcting means executes processing for establishing coincidence between the deflection coordinate system and the design coordinate system after the first correcting means has established coincidence between the beam coordinate system and the design coordinate system.

In a preferred embodiment, the second correcting means establishes coincidence between the deflection coordinate system and the design coordinate system based upon a relationship between the beam coordinate system and the design coordinate system in addition to the relationship between design irradiation positions and the electron beam irradiation positions detected by the detecting means when the plurality of electron beams are deflected by the deflecting means.

In a preferred embodiment, the second correcting means corrects a setting, which is for controlling the deflecting means, in such a manner that coincidence is established between the beam coordinate system and the deflection coordinate system, based upon an amount of rotation between the beam coordinate system and the design coordinate system that is necessary to establish coincidence between the beam coordinate system and the design coordinate system, and an amount of rotation between the deflection coordinate system and the design coordinate system that is necessary to establish coincidence between the deflection coordinate system and the design coordinate system.

In a preferred embodiment, the irradiating means has a plurality of electron beam sources, at least four of the electron beam sources being used when the beam coordinate system and the design coordinate system are made to coincide by the first correcting means.

In a preferred embodiment, the irradiating means has a plurality of electron beam sources, at least one of the electron beam sources being used when the deflection coordinate system and the design coordinate system are made to coincide at the second correcting step, the deflecting means being controlled in such a manner that irradiation positions of the electron beam from this electron beam source are at least three locations, and the deflection coordinate system and design coordinate system being made to coincide at this time based upon irradiation positions of the electron beams, at the at least three locations, detected by the detecting means.

According to another aspect of the present invention, the foregoing object is attained by providing A method of controlling an electron beam exposure apparatus having irradiating means for causing a plurality of electron beams to be arrayed on and to irradiate a substrate, deflecting means for deflecting the plurality of electron beams, which are caused to irradiate the substrate by the irradiating means, by approximately identical amounts of deviation, driving means for driving a stage on which the substrate is placed, and detecting means for detecting irradiation positions of the electron beams which irradiate the stage, the method comprising a first correcting step of establishing coincidence between a design coordinate system and a beam coordinate system, which is decided by the array of the plurality of electron beams caused to irradiate the stage under substantially identical conditions by the irradiating means, based upon a relationship between electron beam irradiation positions detected by the detecting means and design irradiation positions, and a second correcting step of establishing coincidence between a deflection coordinate system associated with the deflecting means and the design coordinate system based upon a relationship between the design irradiation positions and the electron beam irradiation positions detected by the detecting means when the electron beams are deflected by the deflecting means.

In still another aspect of the present invention, the foregoing object is attained by providing a computer readable program for controlling an electron beam exposure apparatus having irradiating means for causing a plurality of electron beams to be arrayed on and to irradiate a substrate, deflecting means for deflecting the plurality of electron beams, which are caused to irradiate the substrate by the irradiating means, by approximately identical amounts of deviation, driving means for driving a stage on which the substrate is placed, and detecting means for detecting irradiation positions of the electron beams which irradiate the stage, the program comprising a first correcting step of establishing coincidence between a design coordinate system and a beam coordinate system, which is decided by the array of the plurality of electron beams caused to irradiate the stage under substantially identical conditions by the irradiating means, based upon a relationship between electron beam irradiation positions detected by the detecting means and design irradiation positions, and a second correcting step of establishing coincidence between a deflection coordinate system associated with the deflecting means and the design coordinate system based upon a relationship between the design irradiation positions and the electron beam irradiation positions detected by the detecting means when the electron beams are deflected by the deflecting means.

Another object of the present invention is to compensate for a temporal offset between the deflection coordinate system and a design coordinate system easily and at high speed.

According to the present invention, the foregoing object is attained by providing an electron beam exposure apparatus having irradiating means that includes a plurality of electron beam sources, wherein a plurality of electron beams emitted by respective ones of the plurality of electron beam sources are arrayed on and irradiate a substrate, deflecting means for deflecting the plurality of electron beams, which are caused to irradiate the substrate by the irradiating means, by approximately identical amounts of deviation, and driving means for driving a stage on which the substrate is placed, the apparatus comprising detecting means for detecting irradiation positions of the electron beams which irradiate the stage, first correcting means for establishing coincidence between a design coordinate system and a deflection coordinate system, which is associated with the deflecting means, based upon a relationship between design irradiation positions and the electron beam irradiation positions detected by the detecting means when a first number of the electron beam sources is used and electron beams which irradiate the stage from each of these electron beam sources are deflected by the deflecting means, calculating means which, after coincidence has been established between the deflection coordinate system and the design coordinate system by the first correcting means, is for calculating parameters which indicate the relationship between the design irradiation positions and the electron beam irradiation positions detected by the detecting means when a second number of the electron beam sources, which is less than the first number, is used and electron beams which irradiate the stage from each of these electron beam sources are deflected by the deflecting means, and second correcting means for correcting offset between the deflection coordinate system and the design coordinate system based upon a change in a parameter calculated by the calculating means at different times.

In a preferred embodiment, the apparatus further comprises third correcting means for establishing coincidence between a design coordinate system and a beam coordinate system, which is decided by an array of irradiation positions of the plurality of electron beams caused to irradiate the stage under substantially identical conditions by the irradiating means, based upon a relationship between electron beam irradiation positions detected by the detecting means and design irradiation positions, wherein the second correcting means executes calculation of parameters after the deflection coordinate system, beam coordinate system and design coordinate system have been made to coincide by the first and third correcting means.

In a preferred embodiment, parameters include coefficients which indicate amount of rotation and amount of linear expansion and contraction between the deflection coordinate system and the design coordinate system.

In a preferred embodiment, the second number is one.

In a preferred embodiment, the calculating means calculates the parameter after the deflection coordinate system and the design coordinate system have been made to coincide by the first correcting means, adopts this parameter as a first parameter, calculates a parameter immediately before a pattern is drawn on the substrate and adopts this parameter as a second parameter, and the second correcting means corrects an offset between the deflection coordinate system and the design coordinate system based upon a difference between the first and second parameters.

In another aspect of the present invention, the foregoing object is attained by providing a method of controlling an electron beam exposure apparatus having irradiating means that includes a plurality of electron beam sources, wherein a plurality of electron beams emitted by respective ones of the plurality of electron beam sources are arrayed on and irradiate a substrate, deflecting means for deflecting the plurality of electron beams, which are caused to irradiate the substrate by the irradiating means, by approximately identical amounts of deviation, driving means for driving a stage on which the substrate is placed, and detecting means for detecting irradiation positions of the electron beams which irradiate the stage, the method comprising a first correcting step of establishing coincidence between a design coordinate system and a deflection coordinate system, which is associated with the deflecting means, based upon a relationship between design irradiation positions and the electron beam irradiation positions detected by the detecting means when a first number of the electron beam sources is used and electron beams which irradiate the stage from each of these electron beam sources are deflected by the deflecting means, a calculating step which, after coincidence has been established between the deflection coordinate system and the design coordinate system by the first correcting means, is a step of calculating parameters which indicate the relationship between the design irradiation positions and the electron beam irradiation positions detected by the detecting means when a second number of the electron beam sources, which is less than the first number, is used and electron beams which irradiate the stage from each of these electron beam sources are deflected by the deflecting means, and a second correcting step of correcting offset between the deflection coordinate system and the design coordinate system based upon a change in a parameter calculated at the calculating step at different times.

In still another aspect of the present invention, the foregoing object is attained by providing a computer readable program for controlling an electron beam exposure apparatus having irradiating means that includes a plurality of electron beam sources, wherein a plurality of electron beams emitted by respective ones of the plurality of electron beam sources are arrayed on and irradiate a substrate, deflecting means for deflecting the plurality of electron beams, which are caused to irradiate the substrate by the irradiating means, by approximately identical amounts of deviation, driving means for driving a stage on which the substrate is placed, and detecting means for detecting irradiation positions of the electron beams which irradiate the stage, the program comprising a first correcting step of establishing coincidence between a design coordinate system and a deflection coordinate system, which is associated with the deflecting means, based upon a relationship between design irradiation positions and the electron beam irradiation positions detected by the detecting means when a first number of the electron beam sources is used and electron beams which irradiate the stage from each of these electron beam sources are deflected by the deflecting means, a calculating step which, after coincidence has been established between the deflection coordinate system and the design coordinate system by the first correcting means, is a step of calculating parameters which indicate the relationship between the design irradiation positions and the electron beam irradiation positions detected by the detecting means when a second number of the electron beam sources, which is less than the first number, is used and electron beams which irradiate the stage from each of these electron beam sources are deflected by the deflecting means, and a second correcting step of correcting offset between the deflection coordinate system and the design coordinate system based upon a change in a parameter calculated at the calculating step at different times.

The above-described electron beam exposure apparatus, a method of controlling the same or an electron beam exposure apparatus controlled based upon a control program are ideal for manufacturing devices.

Further objects, features and advantages of the present invention will become apparent from the following detailed description of embodiments of the present invention with reference to the accompanying drawings.

BRIEF DESCRIPTION OF THE DRAWINGS

FIGS. 6A–6C are diagrams for describing measurement based upon a Faraday cup;

FIG. 16 is a diagram for describing design exposure fields;

FIGS. 17A and 17B are diagrams for describing actual exposure fields;

DESCRIPTION OF THE PREFERRED EMBODIMENTS (First Embodiment)

[Constituting Elements of Electron Beam Exposure Apparatus]

Figure 1:
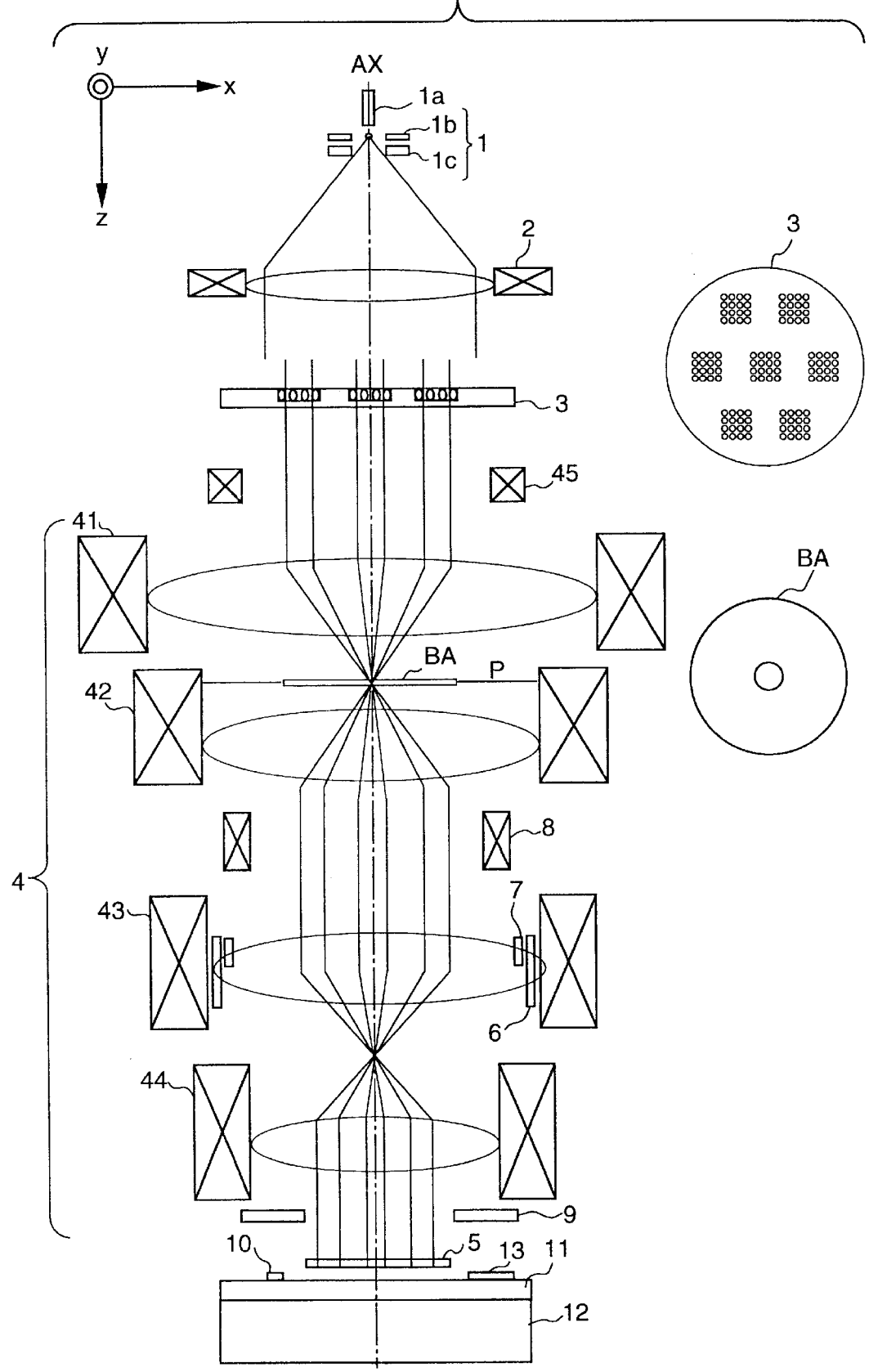
FIG. 1 is a diagram illustrating the principal components of an electron beam exposure apparatus according to the present invention.

FIG. 1 is a schematic view showing a principal portion of an electron beam exposure apparatus according to the present invention.

Referring to FIG. 1, reference numeral 1 denotes an electron gun constituted by a cathode 1a, a grid 1b, and an anode 1c. Electrons emitted by the cathode 1a form crossover images between the grid 1b and the anode 1c. These crossover images will be referred to as a "source" hereinafter.

Electrons coming from the source are converted into nearly collimated electron beams by a condenser lens 2, the front-side focal point position of which is located at the source position. The nearly parallel electron beams enter an element electron optical system array 3. The element electron optical system array 3 is formed by arranging a plurality of element electron optical systems each made up of a blanking electrode, aperture, and electron lens, in a direction perpendicular to an optical axis AX. The element electron optical system array 3 will be described in detail later.

The element electron optical system array 3 forms a plurality of intermediate images of the source. The individual intermediate images are projected in a reduced scale by a reduction electron optical system 4, thus forming source images on a wafer 5.

In this case, the elements of the element electron optical system array 3 are set so that the interval between adjacent source images on the wafer 5 equals an integer multiple of the size of each source image. Furthermore, the element electron optical system array 3 varies the positions, in the optical axis direction, of the intermediate images in correspondence with the curvature of field of the reduction electron optical system 4, and corrects in advance aberrations produced upon projecting the intermediate images onto the wafer 5 in the reduced scale by the reduction electron optical system 4.

The reduction electron optical system 4 comprises a symmetric magnetic doublet made up of a first projection lens 41 (43) and second projection lens 42 (44). If f1 represents the focal length of the first projection lens 41 (43) and f2 represents the focal length of the second projection lens 42 (44), the distance between these two lenses is f1+f2. The object point on the optical axis Ax matches the focal point position of the first projection lens 41 (43), and its image point is formed at the focal point of the second projection lens 42 (44). This image is reduced to −f2/f1. Since two lens magnetic fields are set to act in opposite directions, Seidel's aberrations except for Seidel's five aberrations, i.e., spherical aberration, isotropic astigmatism, isotropic coma, curvature of field, and on-axis chromatic aberration, and chromatic aberrations associated with rotation and magnification are canceled.

Reference numeral 6 denotes a deflector for deflecting a plurality of electron beams from the element electron optical system array 3 to displace the plurality of source images on the wafer 5 by nearly equal displacement amounts in the X- and Y-directions. Although not shown, the deflector 6 is made up of a main deflector used when the deflection width is large, and a sub-deflector used when the deflection width is small. The main deflector comprises an electromagnetic deflector, and the sub-deflector comprises an electrostatic deflector.

Reference numeral 7 denotes a dynamic focusing coil for correcting errors of the focusing positions of the source images caused by deflection errors produced upon activating the deflector 6; and 8, a dynamic stigmatic coil for correcting astigmatism of the deflection errors produced upon deflection as in the dynamic focusing coil 7.

Reference numeral 9 denotes a reflected electron detector for detecting reflected electrons or secondary electrons produced when the electron beams from the element electron optical system array 3 are irradiated onto alignment marks formed on the wafer 5 or marks on a stage reference plate 13.

Reference numeral 10 denotes a Faraday cup having two single knife edges extending in the X- and Y-directions. The Faraday cup 10 detects the charge amount of the source image formed by the electron beam from each element electron optical system.

Reference numeral 11 denotes a θ-Z stage which carries the wafer, and is movable in the direction of the optical axis AX (Z-axis) and in the rotation direction about the Z-axis. The above-mentioned stage reference plate 13 and the Faraday cup 10 are fixed on the θ-Z stage 11.

Reference numeral 12 denotes an X-Y stage which carries the θ-Z stage, and is movable in the X- and Y-directions perpendicular to the optical axis AX (Z-axis).

Figure 2:
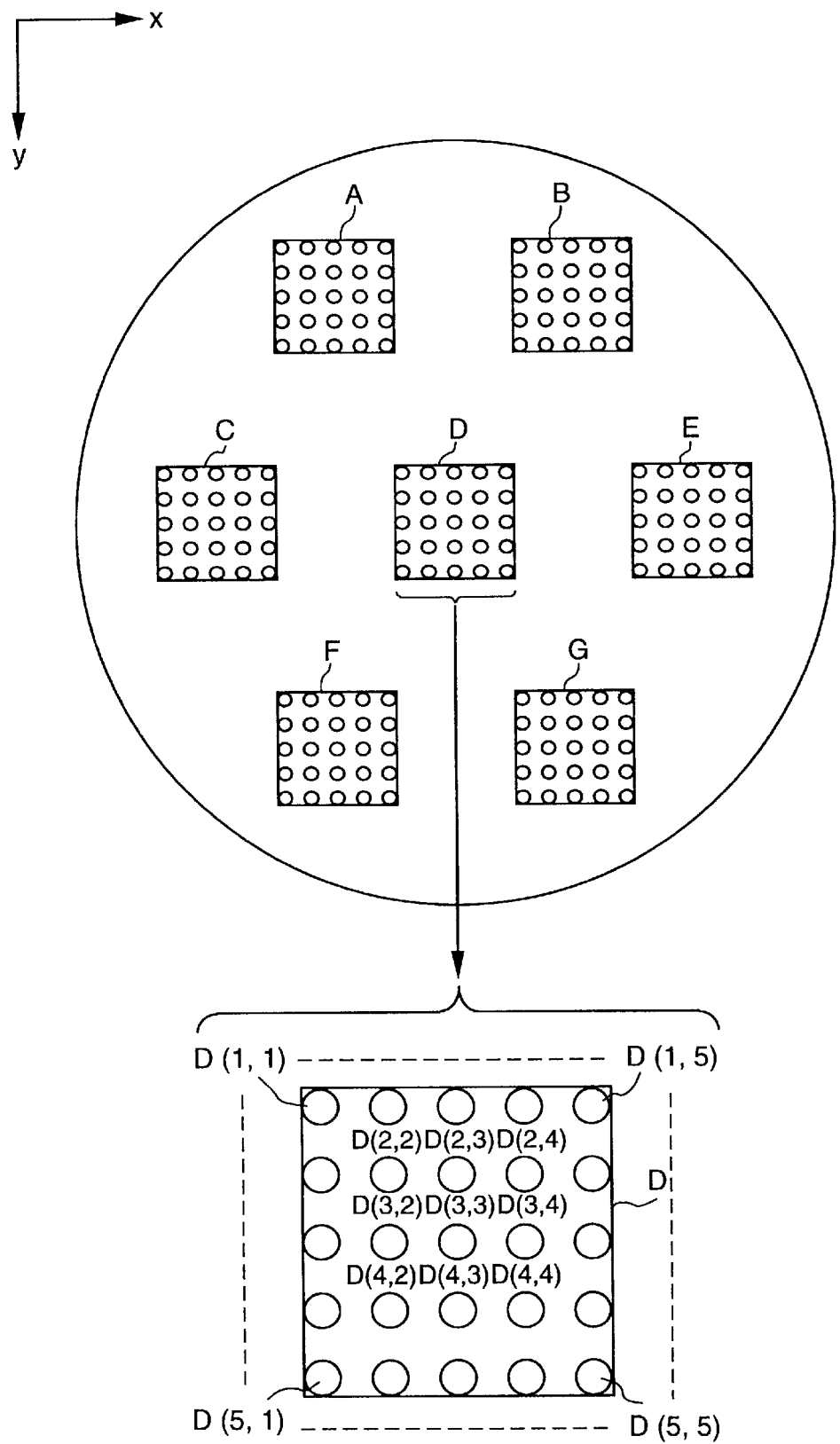
FIG. 2 is a diagram for describing an element electron optical system array.

The element electron optical system array 3 will be explained below with reference to FIG. 2.

The element electron optical system array 3 includes a group (subarray) of a plurality of element electron optical systems, and a plurality of subarrays are formed. In this embodiment, seven subarrays A to G are formed. In each subarray, a plurality of element electron optical systems are two-dimensionally arranged. In each subarray of this embodiment, 25 element electron optical systems like D(1, 1) to D(5,5) are formed, and form source images which are arranged at intervals of a pitch pb ($\mu$m) on the wafer in both the X- and Y-directions via the reduction electron optical system 4.

Figure 3:
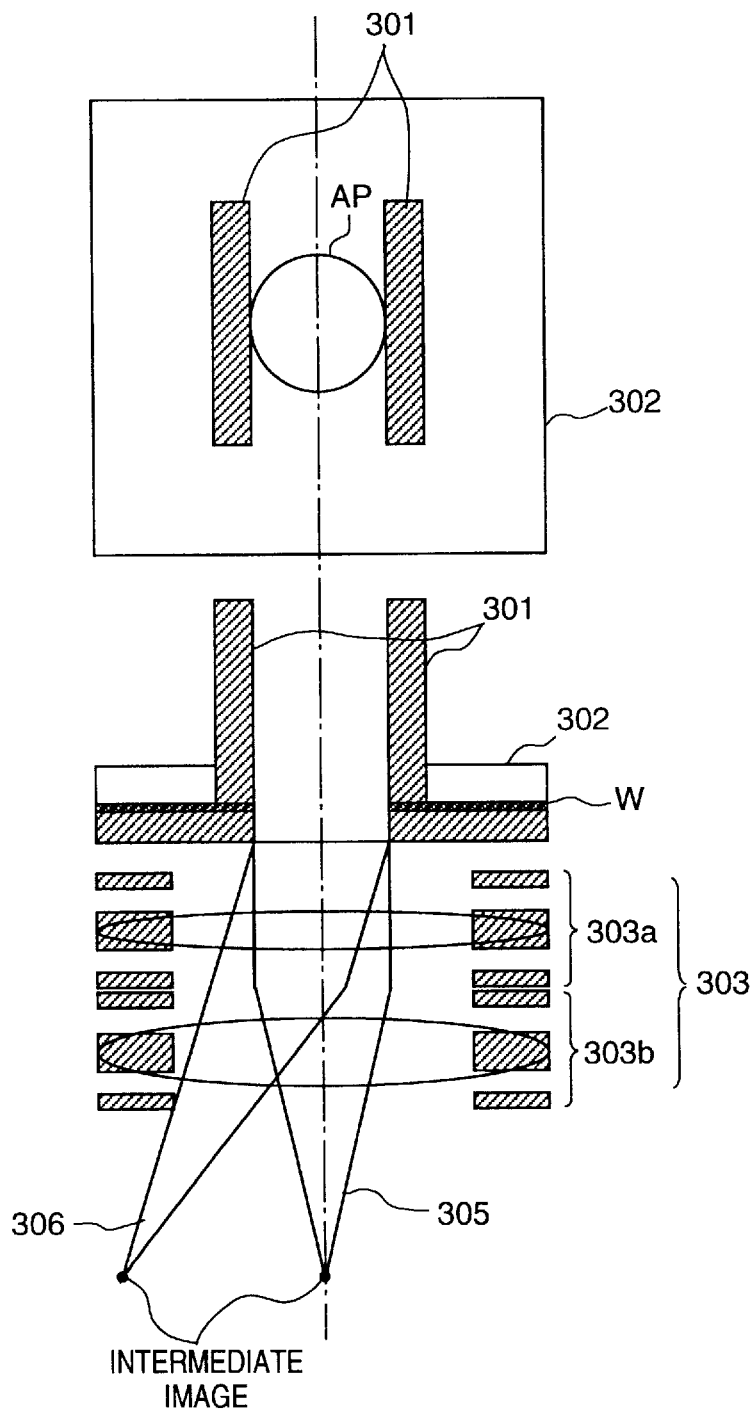
FIG. 3 is a diagram for describing an element electron optical system.

FIG. 3 is a sectional view of each element electron optical system.

Referring to FIG. 3, reference numeral 301 denotes a blanking electrode which is made up of a pair of electrodes and has a deflection function; and 302, a board which has an aperture (AP) for defining the shape of an electron beam that passes therethrough, and is common to other element electron optical systems. On the board 302, the blanking electrode 301 and a wiring (W) for turning on/off the electrode are formed. Reference numeral 303 denotes an electron lens using two unipotential lenses 303a and 303b each of which is built by three aperture electrodes by setting the upper and lower electrodes at an identical acceleration potential V0 and maintaining the middle electrode at another potential V1 or V2, and has a convergence function.

Figure 4A:
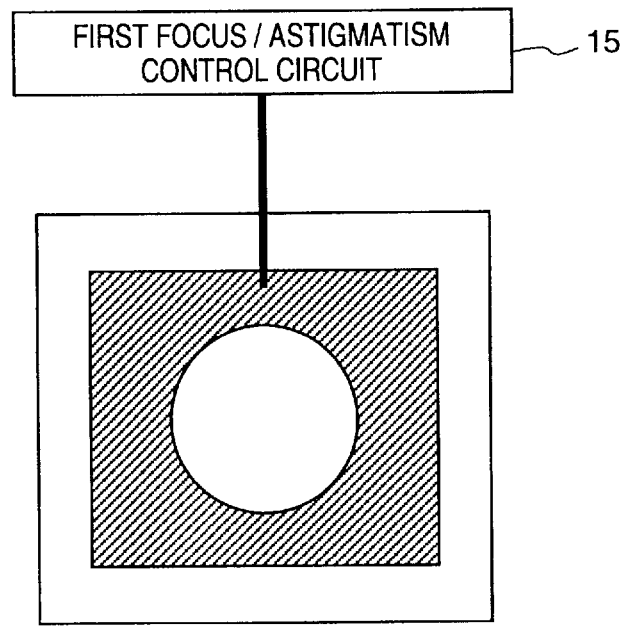
FIGS. 4A and 4B are diagrams for describing electrodes of the element electron optical system.

The upper, middle, and lower electrodes of the unipotential lens 303a, and the upper and lower electrodes of the unipotential lens 303b have a shape, as shown in FIG. 4A, and the upper and lower electrodes of the unipotential lenses 303a and 303b are set at a common potential by a first focal point/astigmatism control circuit 15 (to be described later) in all the element electron optical systems.

Since the potential of the middle electrode of the unipotential lens 303a can be set by the first focal point/astigmatism control circuit 15 in units of element electron optical systems, the focal length of the unipotential lens 303a can be set in units of element electron optical systems.

Figure 4B:
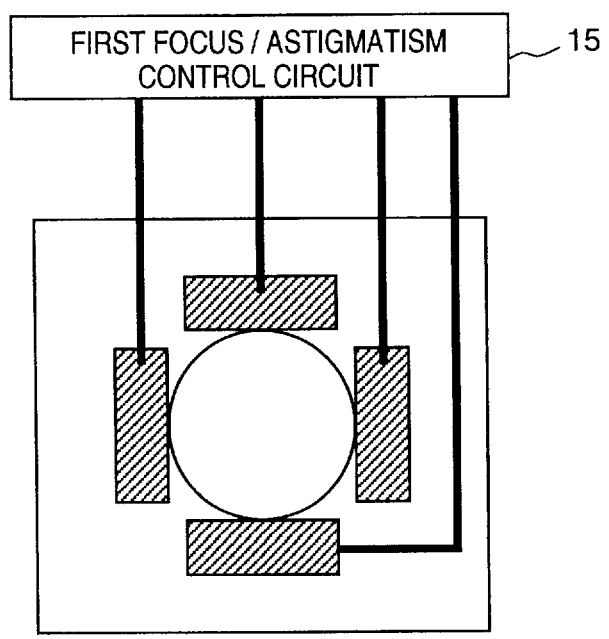

Also, since the middle electrode of the unipotential lens 303b is made up of four electrodes, as shown in FIG. 4B, and their potentials can be independently set by the first focal point/astigmatism control circuit 15 and can also be independently set in units of element electron optical systems, the unipotential lens 303b can have different focal lengths in a section perpendicular thereto and the focal lengths can also be independently set in units of element electron optical systems.

As a consequence, by independently controlling the middle electrodes of the element electron optical systems, the electron optical characteristics (intermediate image formation position, astigmatism) of the element electron optical systems can be controlled.

Electron beams which are converted into nearly collimated beams by the condenser lens 2 form intermediate images of the source by an electron lens 303 via the blanking electrode 301 and the aperture (AP). At this time, when no electric field is applied across the electrodes of the blanking electrode 301, the electron beams are not deflected like electron beams 305. On the other hand, when an electric field is applied across the electrodes of the blanking electrode 301, the electron beams are deflected like electron beams 306. Since the electron beams 305 and 306 have different angular distributions on the object surface of the reduction electron optical system 4, the electron beams 305 and 306 become incident on different regions at the pupil position (on a plane P in FIG. 1) of the reduction electron optical system 4. Hence, a blanking aperture BA that transmits the electron beams 305 alone is arranged at the pupil position (on the plane P in FIG. 1) of the reduction electron optical system.

The individual element electron optical systems respectively set the potentials of their two middle electrodes to correct curvature of field and astigmatism produced when the intermediate images formed thereby are projected onto the surface to be exposed by the reduction electron optical system 4 in a reduced scale, thereby varying their electron optical characteristics (intermediate image formation position and astigmatism). In this embodiment, however, in order to reduce the number of wiring lines between the middle electrodes and the first focal point/astigmatism control circuit 15, the element electron optical systems in a single subarray are set to have identical electron optical characteristics, and the electron optical characteristics (intermediate image formation position, astigmatism) of the element electron optical systems are controlled in units of subarrays.

Furthermore, in order to correct distortion produced when a plurality of intermediate images are projected onto the surface to be exposed by the reduction electron optical system 4 in a reduced scale, the distortion characteristics of the reduction electron optical system 4 are detected in advance, and the positions, in a direction perpendicular to the optical axis of the reduction electron optical system 4, of the individual element electron optical systems are set based on the detected characteristics.

Figure 5:
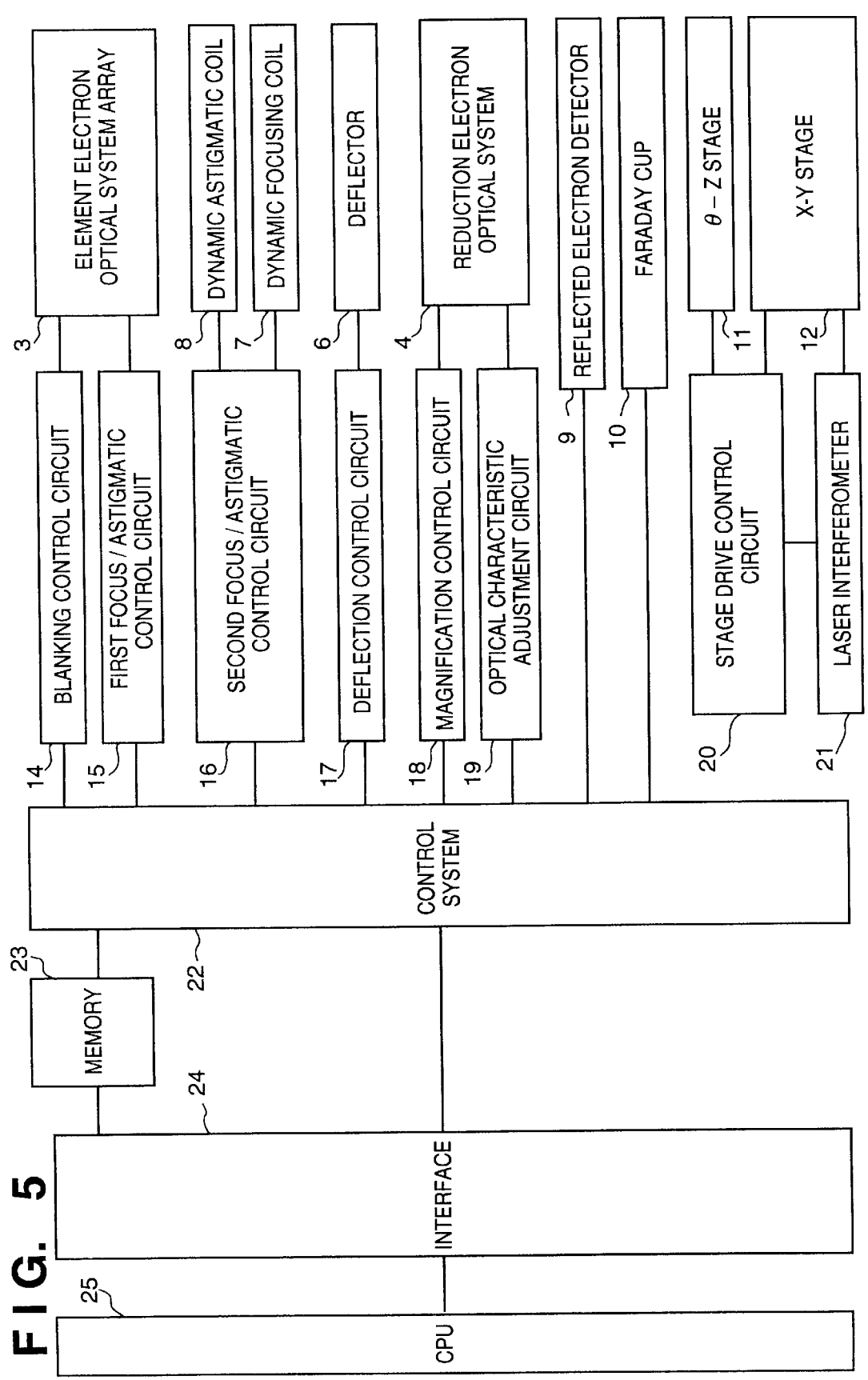
FIG. 5 is a diagram for describing a system configuration according to the present invention.

FIG. 5 shows the system arrangement of this embodiment.

A blanking control circuit 14 ON/OFF-controls the blanking electrodes of the individual element electron optical systems of the element electron optical system array 3. The first focal point/astigmatism control circuit 15 controls the electron optical characteristics (intermediate image formation position, astigmatism) of the individual element electron optical systems of the element electron optical system array 3.

A second focal point/astigmatism control circuit 16 controls the dynamic stigmatic coil 8 and the dynamic focusing coil 7 to control the focal point position and astigmatism of the reduction electron optical system 4. A deflection control circuit 17 controls the deflector 6. A magnification adjustment circuit 18 adjusts the magnification of the reduction electron optical system 4. An optical characteristic circuit 19 adjusts aberration of rotation and the optical axis by changing the energization current of an electromagnetic lens that builds the reduction electron optical system 4.

A stage driving control circuit 20 controls driving of the θ-Z stage, and also controls driving of the X-Y stage 12 in cooperation with a laser interferometer 21 for detecting the position of the X-Y stage 12.

A control system 22 synchronously controls the plurality of control circuits described above, the reflected electron detector 9, and the Faraday cup 10 so as to attain exposure and alignment on the basis of data read out from a memory 23 that stores information associated with a drawing pattern. The control system 22 is controlled via an interface 24 by a CPU 25 that controls the overall electron beam exposure apparatus.

[Operation]

The operation of the electron beam exposure apparatus according to this embodiment will now be described with reference to FIG. 5.

In order to calibrate the exposure apparatus, the CPU 25 instructs the control system 22, via the interface 24, to execute calibration. When the calibration execution instruction is received, the control system 22 executes calibration processing in accordance with the flowchart shown in FIG. 18.

In calibration processing, the relationship among the beam coordinate system (Xa, Ya) defined by the reference positions of the plurality of electron beams which irradiate the XY stage 12 from the element electron optical system, the deflection coordinate system (Xd, Yd) defined in the deflector 6 and the stage coordinate system (Xs, Ys) defined in the XY stage 12 is examined and the offset between the coordinate systems is corrected. In this embodiment, the irradiation positions at which the XY stage 12 is irradiated with the electron beams are adopted as beam reference positions in a case where the electron beams are not deflected by the deflector 6. However, an arrangement may be adopted in which the amounts by which the electron beams are displaced are made substantially identical when the electron beam irradiation positions are detected, and the irradiation positions at which the electron beams irradiate the XY stage 12 in this case may be used as the beam reference positions.

At step S10 in FIG. 18, the control system 22 decides the element electron optical system as the source for generating the electron beams used in the processing below. In this embodiment, the element electron optical system is selected from A(3,3), B(3,3), C(3,3), D(3,3), E(3,3), F(3,3) and G(3,3) situated at the centers of the element electron optical systems A~G of the array 3 shown in FIG. 2. More specifically, D(3,3) situated at the center of the element electron optical system array 3 is selected, steps S20~S50 are executed, then the remaining element electron optical systems A(3,3), B(3,3), C(3,3), E(3,3), F(3,3) and G(3,3) are selected in regular order, steps S20~S50 are executed for each system and the program subsequently proceeds to step S70.

Figure 19:
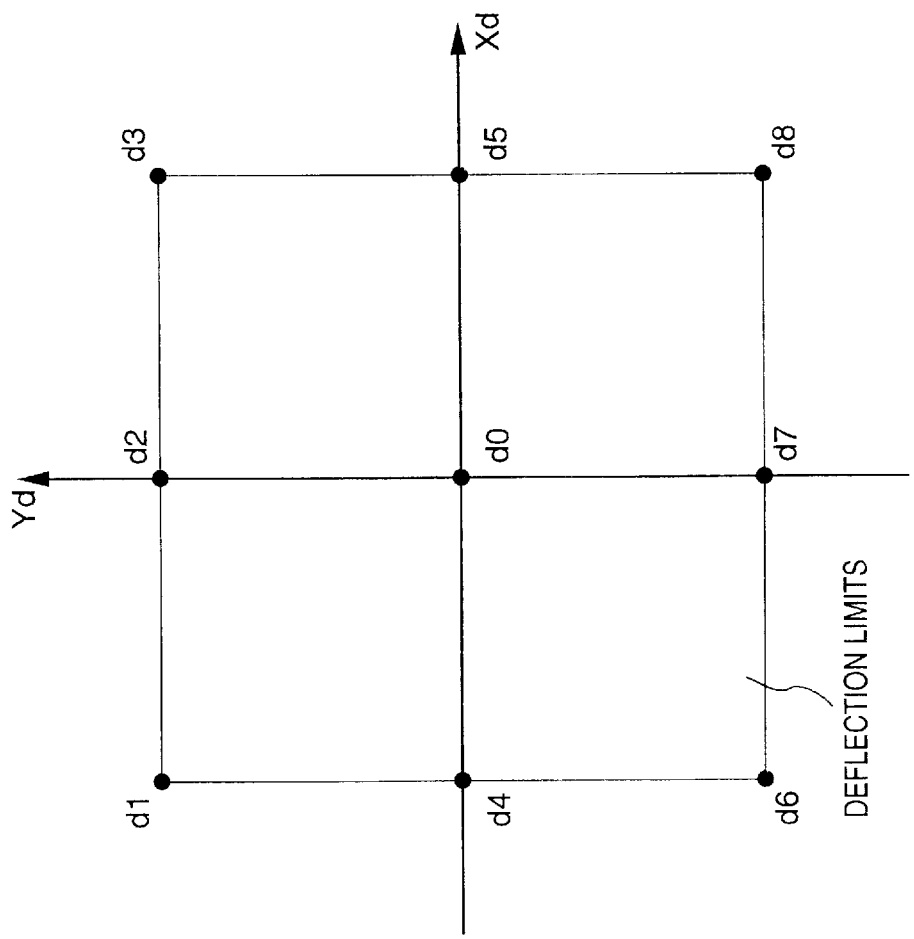
FIG. 19 is a diagram illustrating deflection limits of electron beams by a deflector in a deflection coordinate system (Xd, Yd)

At step S20, the control system 22 adjusts the position to which the electron beam is deflected by the deflector 6 (the position at which the electron beam irradiates the XY stage 12). FIG. 19 is a diagram showing the limits of deflection of the electron beam by the deflector 6 in the deflection coordinate system (Xd, Yd). The control system 22 first controls the deflector 6 in such a manner that the electron beam will not be deflected, i.e., in such a manner that the deflection position will be d0, executes steps S30, S40, then controls the deflector 6 in regular order in such a manner that the deflected position becomes d1~d8 and executes steps S30, S40 with regard to each deflection position.

The electron beam irradiation position (X coordinate) in the stage coordinate system (Xs, Ys) is sensed at step S30. More specifically, the control system 22 instructs the stage drive control circuit 20 to move the XY stage 12 in such a manner that the Faraday cup 10 is situated near the electron beam irradiation position. The control system 22 then instructs the blanking control circuit 14 to turn off only the blanking electrode 301 of the target element electron optical system and turn on the blanking electrodes 301 of the other element electron optical systems in such a manner that the only the electron beam emitted by the target element electron optical system, namely the element electron optical system [e.g., D(3,3)] selected at step S10, will impinge upon the XY stage 12.

Next, the control system 22 instructs the stage drive circuit 20 to move the XY stage 12 in the X direction (the measurement direction), as shown in FIG. 6A, so that the X-direction measurement knife edge NFX of the Faraday cup 10 cuts across the electron beam BE from the target element electron optical system. At this time the relationship between the quantity of electrons from the element electron optical system and the position of the XY stage 12 in the X direction measured by the laser interferometer 21 is stored in a memory, which is not shown. FIG. 6B shows an example of the signal indicating this relationship between the quantity of electrons and position. The control system 22 differentiates the signal shown in FIG. 6B and obtains a differential signal of the kind shown in FIG. 6C. The control system 22 finds the electron beam irradiation position xs in the stage coordinate system (Xs, Ys) from this differential signal using the slice method or correlation method, etc., employed in the prior art.

The electron beam irradiation position (Y coordinate) in the stage coordinate system (Xs, Ys) is sensed at step S40. More specifically, the processing of step S30 need only be applied in the Y direction. That is, the control system 22 instructs the stage drive control circuit 20 to move the XY stage 12 in the Y direction (measurement direction) so that the Y-direction measurement knife edge NFY of the Faraday cup 10 cuts across the electron beam BE from the target element electron optical system. The irradiation position ys of the electron beam in the stage coordinate system (Xs, Ys) is obtained through a method similar to that described above.

By executing the processing of steps S20~S50 with regard to the deflection positions d0~d8, the electron beam irradiation position (xs, ys) at each of the deflection positions d0~d8 can be detected.

Further, by executing the processing of steps S20~S60 with regard to the element electron optical systems A(3,3) ~G(3,3), the electron beam irradiation position (xs, ys) at each of the deflection positions d0~d8 can be detected for each electron optical system.

Figure 7A:
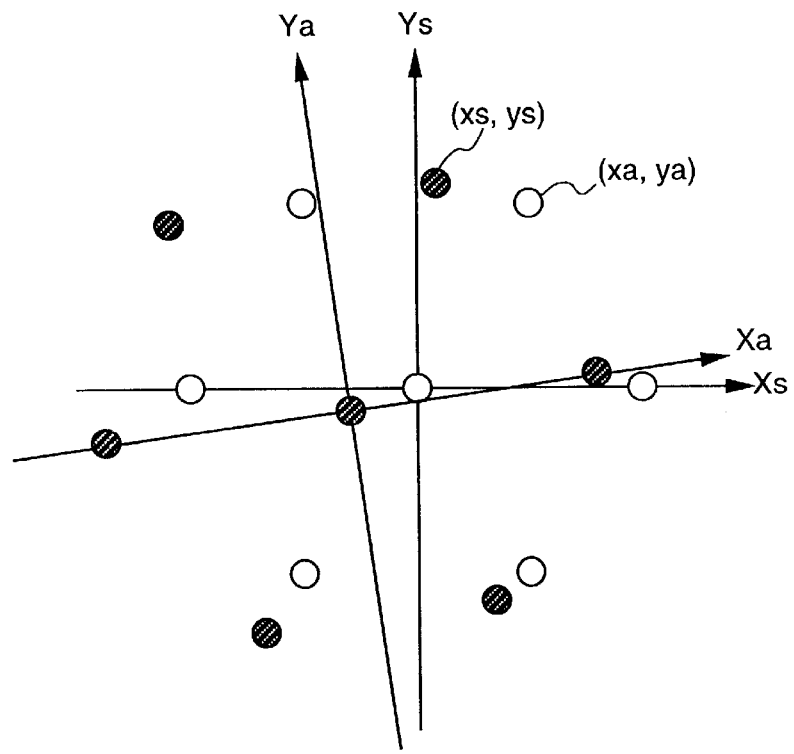
FIGS. 7A and 7B are diagrams for describing actual beam positions and design beam positions.

FIG. 7A illustrates the relationship between actual beam reference positions (the black circles) detected by the above-described processing and the design beam reference positions (the white circles) with regard to each of the element electron optical systems. In terms of design, the stage coordinate system and beam coordinate system coincide and therefore, the design beam reference positions become the white circles in the drawing when the stage coordinate system is adopted as the reference.

Figure 7B:
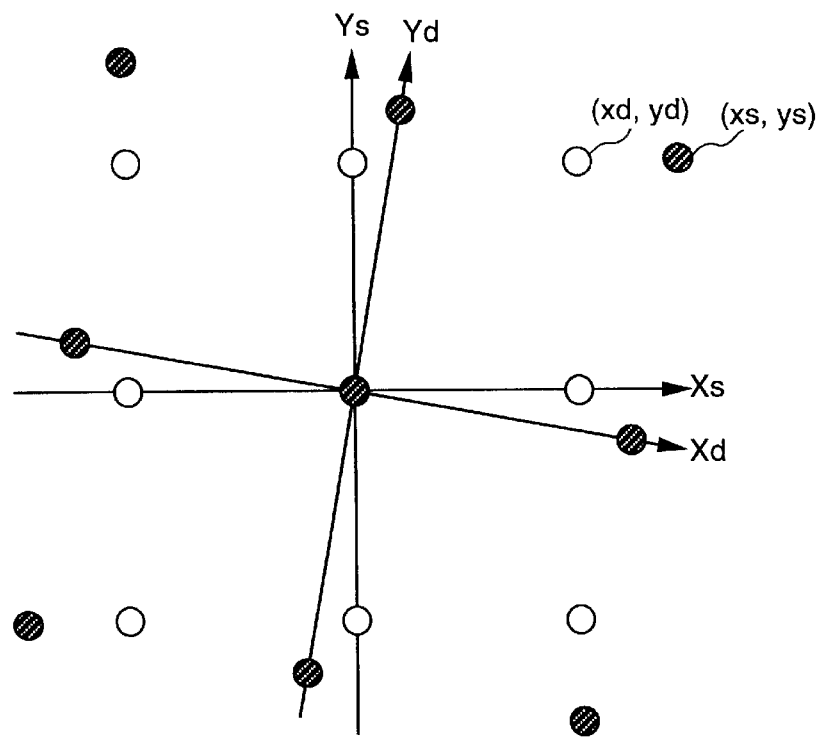

FIG. 7B illustrates the relationship between actual deflection positions (the black circles) detected by the above-described processing and the design deflection positions (the white circles) with regard to one element electron optical system. In terms of design, the stage coordinate system and deflection coordinate system coincide and therefore, the design deflection positions become the white circles in the drawing when the stage coordinate system is adopted as the reference.

As illustrated in FIGS. 7A and 7B, a difference develops between the actual beam irradiation positions and the design positions. This is caused by mismatching between the beam coordinate system (Xa, Ya) defined by the reference positions of the plurality of electron beams and the stage coordinate system (Xs, Ys), and by mismatching between the deflection coordinate system (Xd, Yd) defined in the deflector 6 and the stage coordinate system (Xs, Ys).

The reduction electron optical system 4 and the stage control circuit 20 are adjusted at step S70 based upon the results of the detection in such a manner that the beam coordinate system and stage coordinate system will coincide. First, the control system 22 assumes that the relationship between the beam coordinate system (Xa, Ya) and the stage coordinate system (Xs, Ys) is as indicated by the following equations:

$$Xa = 0x + (k \cdot \cos \alpha) \cdot Xs - (k \cdot \sin \alpha) \cdot Ys \quad (1)$$

$$Ya = 0y + (k \cdot \sin \alpha) \cdot Xs + (k \cdot \cos \alpha) \cdot Ys \quad (2)$$

where

0x: amount of translation in the X direction of beam coordinate system;

0y: amount of translation in the Y direction of beam coordinate system;

k: amount of isotropic linear expansion/contraction of beam coordinate system; and α: amount of rotation of beam coordinate system; and The coefficients 0x, 0y, k, α are obtained by the method of least squares using the actual beam reference position (xs, ys) in the stage coordinate system (Xs, Ys) with regard to each element electron optical system obtained by the above-described processing, and the design beam reference position (xa, ya) in the stage coordinate system (Xs, Ys), and the relationship between the beam coordinate system (Xa, Ya) and the stage coordinate system (Xs, Ys) is decided. Since there are four coefficients to be decided, it will suffice to measure the beam reference positions in relation to a minimum of four element electron optical systems.

Next, the control system 22 instructs the magnification control circuit 18 to set the magnification of the reduction electron optical system 4, based upon the decided coefficient k, in such a manner that the relation k=1 is established. Further, on the basis of the coefficients 0x, 0y, α, the control system 22 decides correction coefficients for correcting the stage control circuit 20 and sets up a new stage coordinate system (Xs', Ys') indicated by the following equations:

$$Xa = Xs' = (\cos \alpha) \cdot Xs - (\sin \alpha) \cdot Ys \quad (3)$$

$$Ya = Ys' = (\sin \alpha) \cdot Xs + (\cos \alpha) \cdot Ys \quad (4)$$

As a result, the beam coordinate system (Xa, Ya) and the stage coordinate system (Xs', Ys') coincide.

The deflection control circuit 17 is adjusted at step S80 in such a manner that the deflection coordinate system and stage coordinate system will coincide. First, it is assumed that the relationship between the deflection coordinate system (Xd, Yd) defined by the deflector 6 and the stage coordinate system (Xs, Ys) is as indicated by the following equations:

$$Xd = kx \cdot (\cos \beta) \cdot Xs - Kx \cdot (\sin \beta) \cdot Ys \quad (5)$$

$$Yd = ky \cdot (\sin \beta) \cdot Xs + ky \cdot (\cos \beta) \cdot Ys \quad (6)$$

where kx: amount of linear expansion/contraction in X direction of deflection coordinate system;

ky: amount of linear expansion/contraction in Y direction of deflection coordinate system; and β: amount of rotation of deflection coordinate system.

The coefficients kx, ky, β are obtained by the method of least squares using the actual deflection position (xs, ys) in the stage coordinate system (Xs, Ys) with regard to all element electron optical systems obtained by the above-described processing, and the design deflection position (xd, yd) in the stage coordinate system, and the relationship between the deflection coordinate system (Xd, Yd) and the stage coordinate system (Xs, Ys) is decided. Since there are three coefficients to be decided, it will suffice to measure a minimum of three irradiation positions.

Furthermore, the control system 22 calculates the following from Equations (3) through (6):

$$Xd = kx \cdot [\cos (\beta - \alpha)] \cdot Xa - kx \cdot [\sin (\beta - \alpha)] \cdot Ya \quad (7)$$

$$Yd = ky \cdot [\sin (\beta - \alpha)] \cdot Xa + ky \cdot [\cos (\beta - \alpha)] \cdot Ya \quad (8)$$

as a result of which the relationship between the beam coordinate system (Xa, Ya) and the deflection coordinate system (Xd, Yd) is decided. The control system 22 then decides the correction coefficients of the deflection control circuit 17 using the coefficients α, β, kx, ky. As a result, the beam coordinate system (Xa, Ya) and the deflection coordinate system (Xd, Yd) coincide.

As a result of the processing described above, the beam coordinate system (Xa, Ya), the deflection coordinate system (Xd, Yd) and stage coordinate system (Xs', Ys') are brought into coincidence, thereby completing calibration.

Next, the CPU 25 instructs the control system 22, via the interface 24, to execute exposure, whereupon the control system 22 executes the following steps:

(Step 1)

The control system 22 instructs the deflection control circuit 17 to deflect the plurality of electron beams from the array of element electron optical systems by the auxiliary deflector of the deflector 6 and instructs the blanking circuit 14 to turn the blanking electrodes of each of the element electron optical systems on and off in conformity with the pattern to be exposed on the wafer 15. At this time, the XY stage 12 is moved continuously in the X or Y direction. The deflection control circuit 17 controls the deflection position of the electron beam taking into consideration the amount of movement of the XY stage 12.

Figure 8:
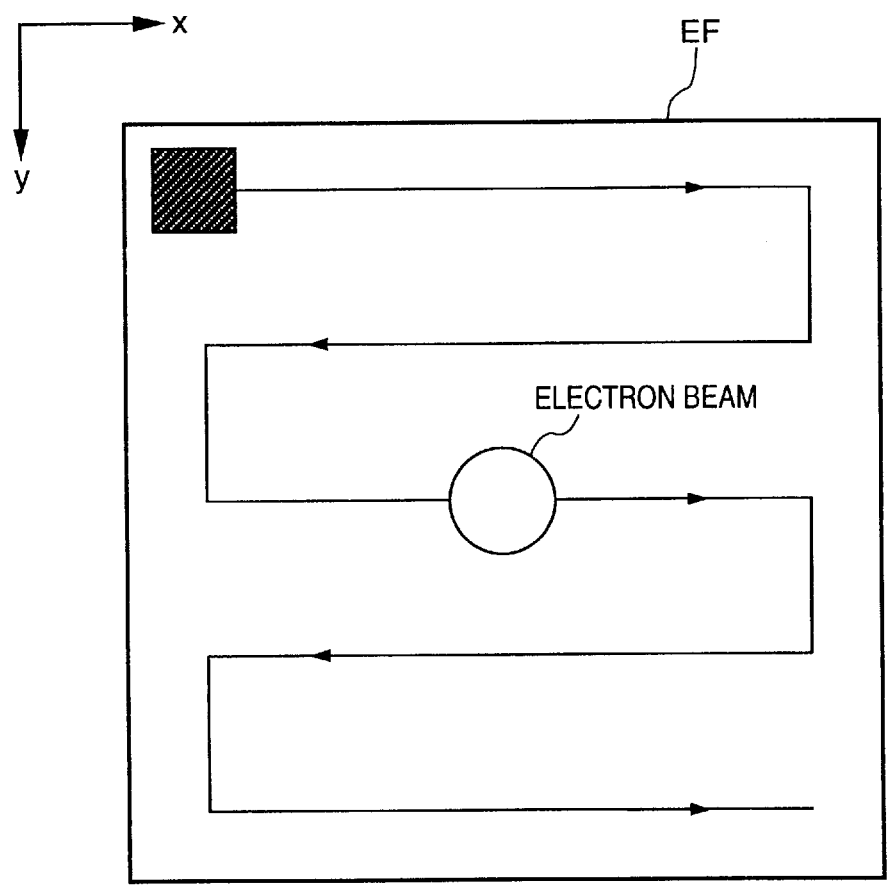
FIG. 8 is a diagram for describing an exposure field (EF)
Figure 9:
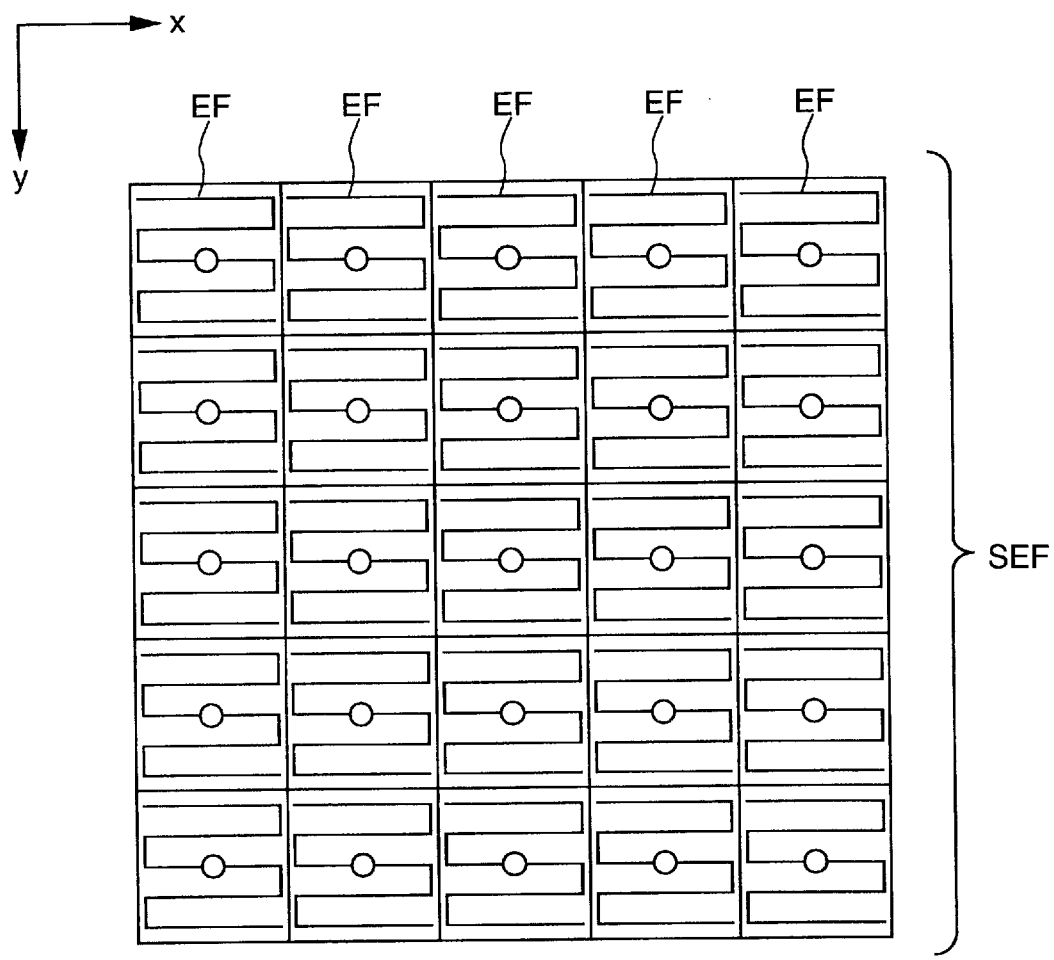
FIG. 9 is a diagram for describing a subarray exposure field (SEF)
Figure 10:
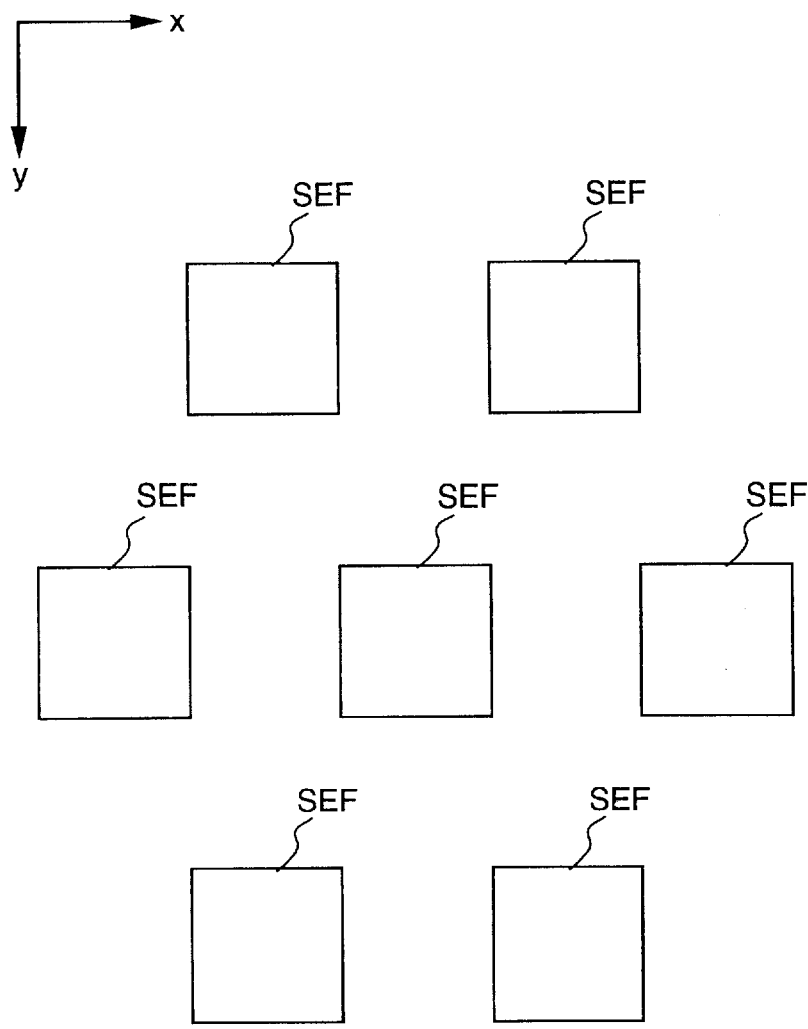
FIG. 10 is a diagram for describing subfields.

As a result, the electron beam from one of the element electron optical systems scans and exposes the exposure field (EF) on the wafer 5 using the black square as the starting point, as shown in FIG. 8. As shown in FIG. 9, the exposure fields (EF) of the plurality of element electron optical systems in the subarray are set so as to be adjacent to one another. As a result, a subarray exposure field (SEF) consisting of the plurality of exposure fields (EF) is exposed on the wafer 5. At the same time, a subfield constituted by subarray exposure fields (SEF) formed by respective ones of the subarrays A through G are exposed on the wafer 5, as illustrated in FIG. 10.

(Step 2)

Figure 11:
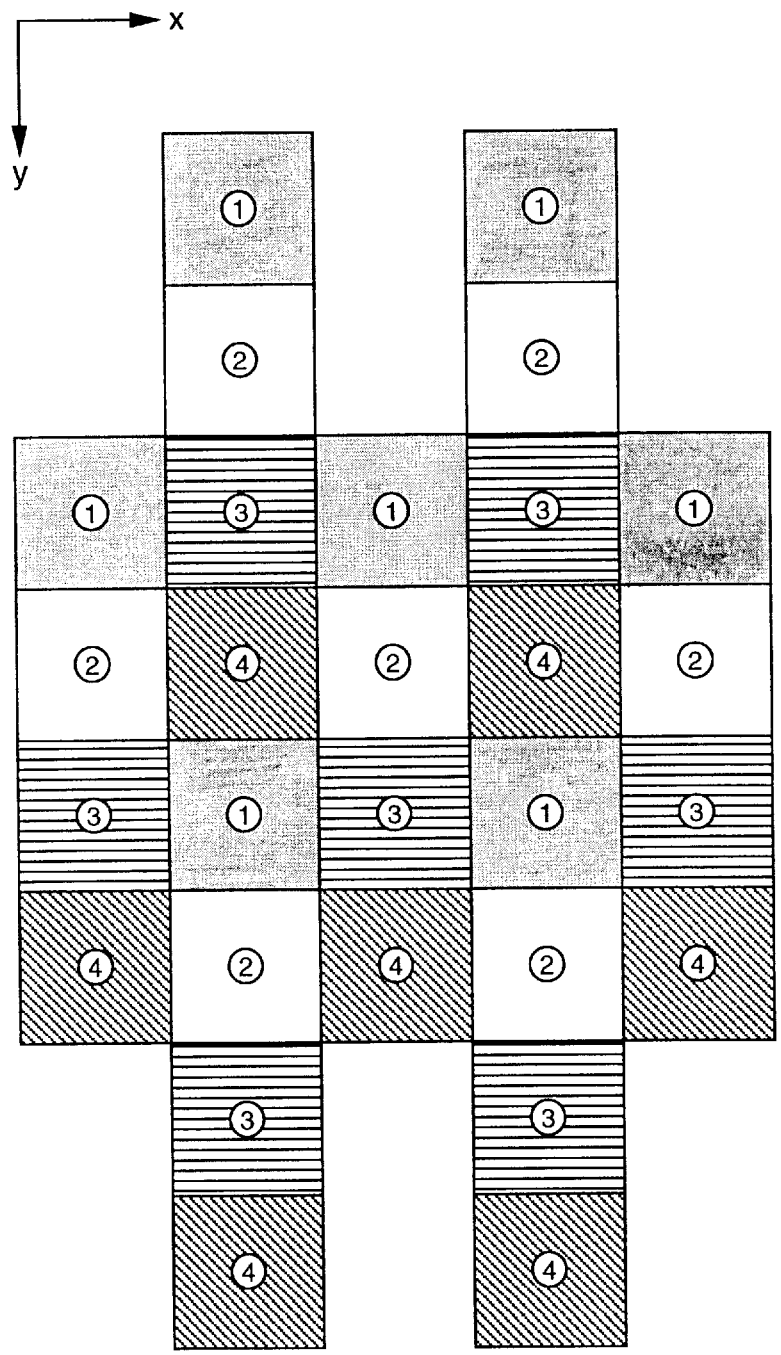
FIG. 11 is a diagram for describing wafer scanning exposure.

After the subfield ① shown in FIG. 11 is exposed, the control system 22 instructs the deflection control circuit 17 to deflect the plurality of electron beams from the array of element electron optical systems by the main deflector of the deflector 6. At this time, the control system 22 instructs the second focus/astigmatism control circuit 16 to control the dynamic focus coil 7 based upon the dynamic focus correction data determined in advance, thereby correcting the focal-point position of the reduction electron optical system 4, and to control the dynamic astigmatic coil 8 based upon dynamic astigmatism data determined in advance, thereby correcting the astigmatism of the reduction electron optical system 4. The operation of step 1 is then performed to expose a subfield ②.

The foregoing steps 1 and 2 are repeated to sequentially expose the subfield in the order of subfields ③, ④, . . . , as shown in FIG. 11, thereby exposing the entire surface of the wafer.

(Second Embodiment)

Since the deflection coordinate system of the deflector 6 changes with the passage of time, it is desired that a deflection coordinate system be obtained for each exposure in the manner of the first embodiment and that the correction coefficients of the deflection control circuit 17 be updated for each exposure. However, this would result in a major decline in throughput.

In particular, in the first embodiment, coefficients indicating the relationship between the beam coordinate system (Xa, Ya) (stage coordinate system (Xs', Ys') and deflection coordinate system (Xd, Yd) are obtained by the method of least squares using the actual deflection position (xs, ys) with respect to the beam reference position in the stage coordinate system (Xs, Ys) in seven element electron optical systems and the design position (xd, yd), whereby the correction coefficients of the deflection control circuit 17 are decided.

In the second embodiment, once calibration has been completed through a method the same as that of the first embodiment, calibration is carried out upon detecting the beam reference position and deflection position with regard to electron beams from fewer than the seven element electron optical systems, and preferably from only one of the seven element electron optical systems.

An example of the operation according to this embodiment will now be described.

Figure 20:
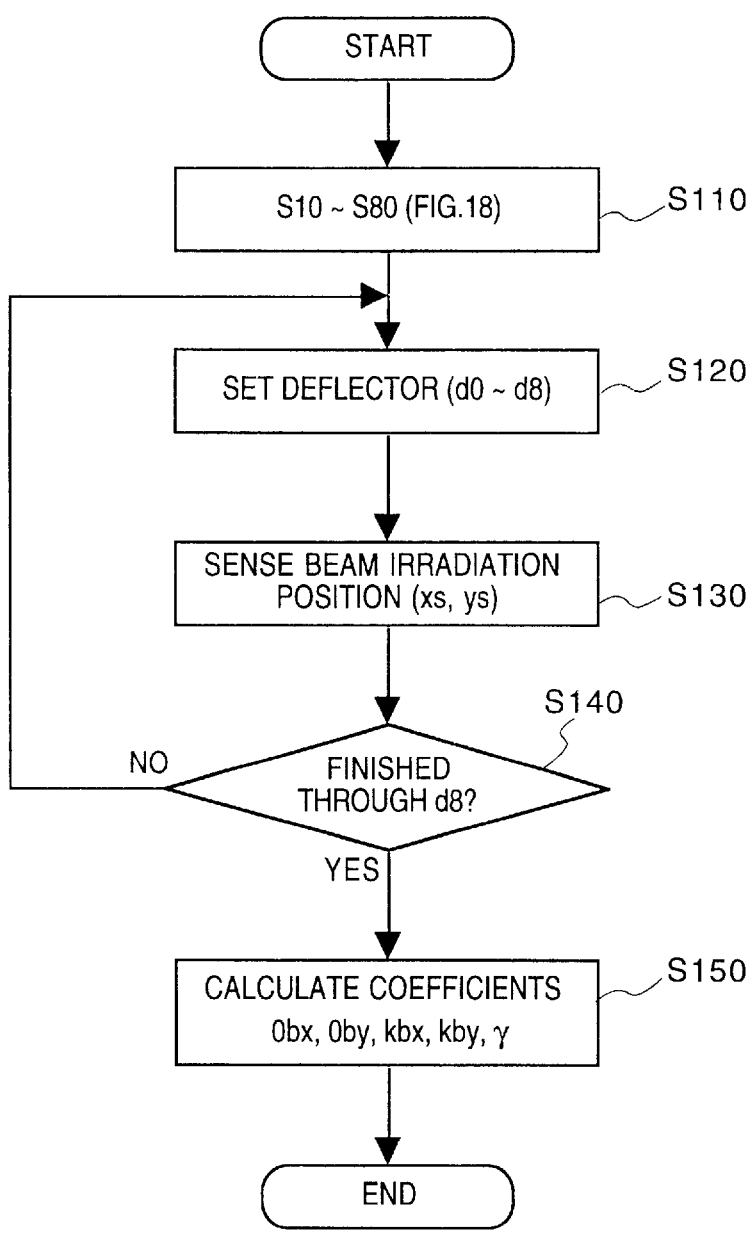
FIG. 20 is a flowchart illustrating the procedure of calibration processing (main calibration processing) according to a second embodiment of the present invention.

FIG. 20 is a flowchart illustrating the procedure of calibration processing (main calibration processing) according to this embodiment. Upon receiving a calibration execution instruction from the CPU 25, the control system 22 first executes calibration processing according to the first embodiment, namely the processing illustrated by the flowchart of FIG. 18, at step S110. By virtue of this processing, correction coefficients are decided and the deflection control circuit 17 and stage drive control circuit 20 are corrected.

At steps S120~S140, the electron beam emitted by the element electron optical system D(3,3) is caused to irradiate the XY stage 12 and the deflector 6 is controlled to detect the beam irradiation position (xs, ys), through a method similar to that of the first embodiment (steps S20~S40), with regard to each of nine positions, namely the beam reference position d0 and deflection positions d1~d8.

Coefficients indicating the relationship between the detected beam irradiation position (xs, ys) and the design beam irradiation position (xb, yb) are calculated at step S150. By virtue of the processing of step S110, the beam irradiation positions (coordinates) are substantially the same in both the beam coordinate system and the stage coordinate system.

First, the control system 22 assumes that the relationship between the actual beam irradiation position (xs, ys) detected and the design beam irradiation position (xb, yb) is as indicated by the following equations:

$$xb=0bx+(kbx\cdot\cos \gamma)\cdot xs-(kbx\cdot\sin \gamma)\cdot ys \quad (9)$$

$$yb=0bx+(kby\cdot\sin \gamma)\cdot xs+(kby\cdot\cos \gamma)\cdot ys \quad (10)$$

where

0bx: amount of translation in the X direction of the beam coordinate system of element electron optical system D(3,3);

0by: amount of translation in the Y direction of the beam coordinate system of element electron optical system D(3,3);

kbx: amount of linear expansion/contraction in the X direction of the beam coordinate system of element electron optical system D(3,3);

kby: amount of linear expansion/contraction in the Y direction of the beam coordinate system of element electron optical system D(3,3);

γ: amount of rotation of the beam coordinate system of element electron optical system D(3,3).

The control system 22 calculates the coefficients 0bx, 0by, kbx, kby, γ by the method of least squares using the actual beam irradiation position (xs, ys) detected and the design beam irradiation position (xb, yb), stores these values and terminates main calibration processing.

Figure 21:
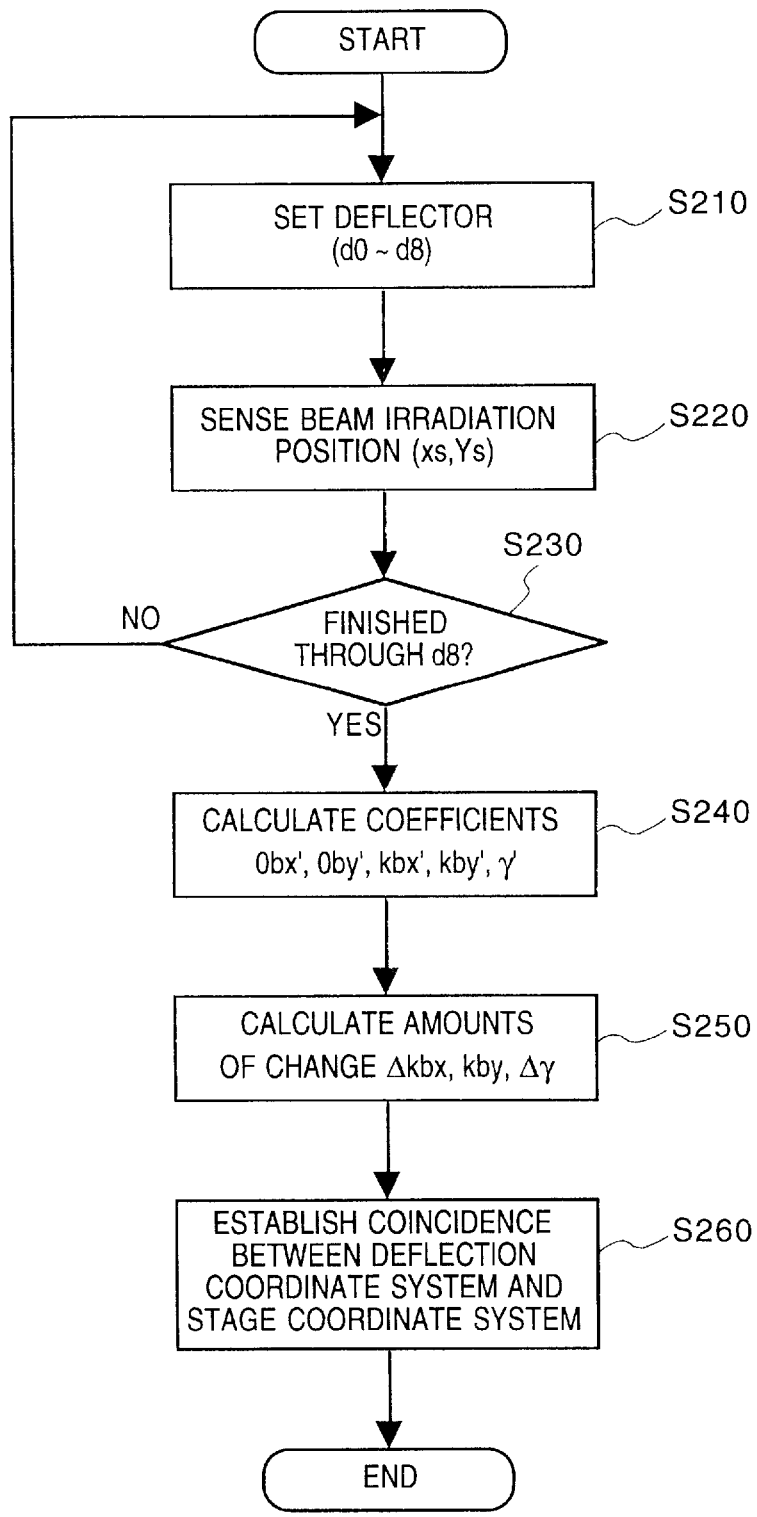
FIG. 21 is a flowchart illustrating the procedure of correction processing (auxiliary calibration processing) executed prior to exposure.

FIG. 21 is a flowchart illustrating the procedure of correction processing (auxiliary calibration processing) executed prior to exposure. First, at steps S210~S230, the control system 22 executes processing similar to that of steps S120~S140 of FIG. 20.

At step S240, control system 22 executes processing similar to that of step S150 of FIG. 20 and stores the coefficients 0bx, 0by, kbx, kby, γ thus calculated as 0bx', 0by', kbx', kby', γ', respectively.

This is followed by step S250, at which the control system 22 calculates the amounts of change Δ0bx, Δ0by, Δkbx, Δkby, Δγ of the coefficients 0bx, 0by, kbx, kby, γ, respectively. It should be noted that the following relations hold: Δ0bx=0bx−0bx', Δ0by=0by−0by', Δkbx=kbx−kbx', Δkby= kby−kby' and Δγ=γ−γ'.

Here, the amounts of change Δ0bx, Δ0by are approximately zero. This is because the change in the XY stage 12 with time is small. Accordingly, in this embodiment, processing is executed following the establishing of the relations Δ0bx=Δ0by=0. However, if the amounts of change Δ0bx, Δ0by exceed predetermined values, then the calibration shown in FIG. 20, for example, should be re-executed.

The control system 22 changes the correction coefficients of the deflection control circuit 17 in accordance with the following equations using the amounts of change Δkbx, Δkby, Δγ and the coefficients α, β, kx, Ky decided by the calibration processing shown in FIG. 20, thereby establishing coincidence between the deflection coordinate system (Xd, Yd) and the stage coordinate system (Xs, Ys):

$$Xd=(kx+\Delta kbx)\cdot\cos (\beta-\alpha+\Delta\gamma)\cdot Xa-(kx+\Delta kbx)\cdot\sin (\beta-\alpha+\Delta\gamma)\cdot Ya \quad 11)$$

$$Yd=(ky+\Delta kby)\cdot\sin (\beta-\alpha+\Delta\gamma)\cdot Xa+(ky+\Delta kby)\cdot\cos (\beta-\alpha+\Delta\gamma)\cdot Ya \quad (12)$$

Thus, in accordance with this embodiment, a change in the deflector 6 with time is corrected by a number of measurements fewer than that of the first embodiment. As a result, it is possible to shorten the time needed to achieve coincidence between the deflection coordinate system and the design coordinate system prior to exposure.

(Third Embodiment)

In the first embodiment, the correction coefficients of the stage control circuit 20 are decided using the coefficient (α) representing the relationship between the stage coordinate system (Xs, Ys) and the beam coordinate system (Xa, Ya), thereby establishing a new stage coordinate system (Xs', Ys'). According to this embodiment, the control system 22 instructs the optical characteristic adjustment circuit 19 to produce rotational distortion in the reduction electron optical system 4 based upon the amount α of rotation of the beam coordinate system, thereby rotating the beam coordinate system (Xa, Ya). In this embodiment, the rotational distortion is produced by the rotating lens 45 provided in the reduction electron optical system 4.

The relationship between the beam coordinate system (Xa, Ya) and the deflection coordinate system (Xd, Yd) at this time is given by the following equations:

$$Xd = kx^* \cos \beta^* Xa - kx^* \sin \beta^* Ya \quad (13)$$

$$Yd = ky^* \sin \beta^* Xa + ky^* \cos \beta^* Ya \quad (14)$$

The control system 22 decides the correction coefficients of the deflection control circuit 17 using the coefficients β, kx, ky. The beam coordinate system (Xa, Ya) and the deflection coordinate system (Xd, Yd) coincide as a result.

(Fourth Embodiment)

Figure 12:
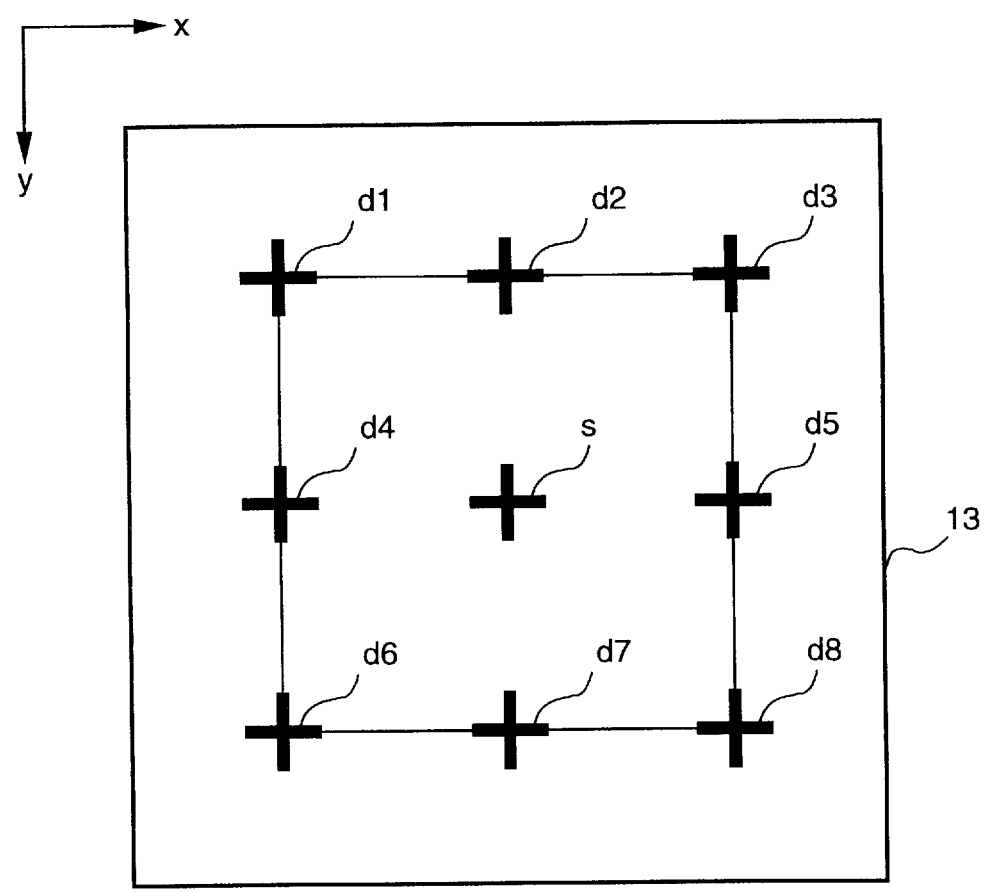
FIG. 12 is a diagram for describing marks on a stage reference plate.

In the first embodiment, the beam reference position and the deflection position of an electron beam are measured using the Faraday cup 11. In this embodiment, the actual beam reference position and the deflection position are measured using marks which correspond to the beam reference position and the deflection positions of electron beams formed on the reference plate 13, as shown in FIG. 12. This corresponds to steps S10~S60 of the flowchart illustrated in FIG. 18.

More specifically, the control system 22 instructs the stage drive control circuit 20 to move the XY stage 12 and position it in the vicinity of a mark S corresponding to the beam reference position of the electron beam formed on the stage reference plate 13.

The control system 22 then instructs the blanking control circuit 14 to turn off only the blanking electrode of the element electron optical system D(3,3) and maintain the other blanking electrodes in the ON state in such a manner that only the electron beam of the element electron optical system D(3,3) will impinge upon the wafer side.

Next, the control system 22 instructs the stage drive control circuit 20 to move the XY stage 12 in the X direction (the measurement direction) so that the mark S crosses the electron beam BE from the element electron optical system D(3,3). Reflected electrons and secondary electrons generated from the mark S at this time are detected by the reflected electron detector 9 and the amount of electrons detected and the position of the XY stage in the X direction measured by the laser interferometer 21 are stored. Based upon signals relating to the resulting amount of electrons and position, the control system 22 obtains the beam reference position of the electron beam by the conventionally employed slice method or correlation method. Furthermore, the control system 22 instructs the deflection control circuit 17 to deflect the electron beam from the element electron optical system D(3,3), detects the electron beam irradiation positions at eight deflection positions, which include the four corners of the deflection limits, by a method similar to that described above using the marks d1~d8 that correspond to these irradiation positions, and obtains the beam deflection positions.

Figure 18:
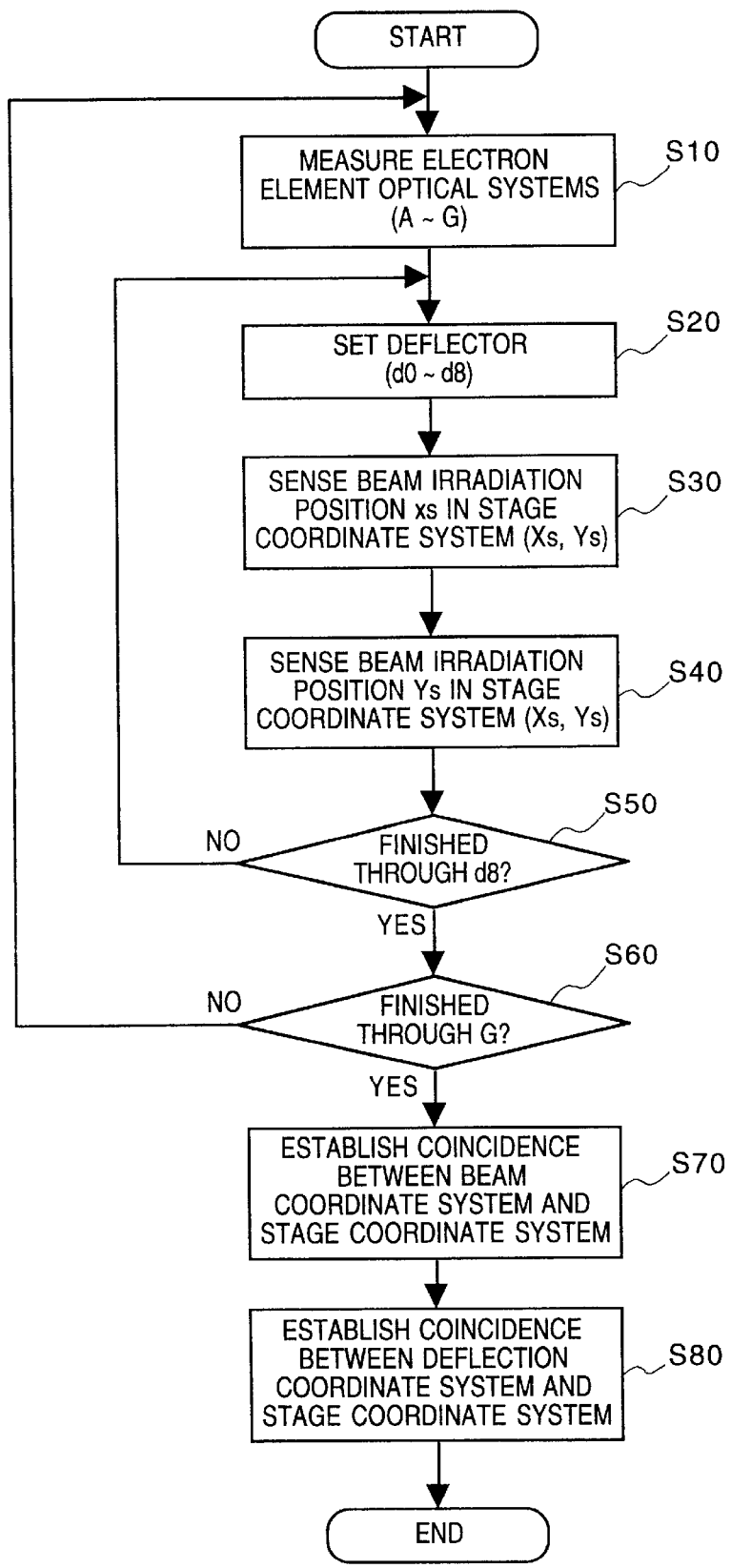
FIG. 18 is a flowchart illustrating the procedure of calibration processing according to an embodiment of the present invention.

The control system 22 thereafter executes steps S70~S80 of the flowchart of FIG. 18 to establish coincidence among the beam coordinate system, deflection coordinate system and stage coordinate system.

(Fifth Embodiment)

An embodiment of a method of producing a device utilizing the electron beam exposure apparatus and exposure method set forth above will be described next.

Figure 13:
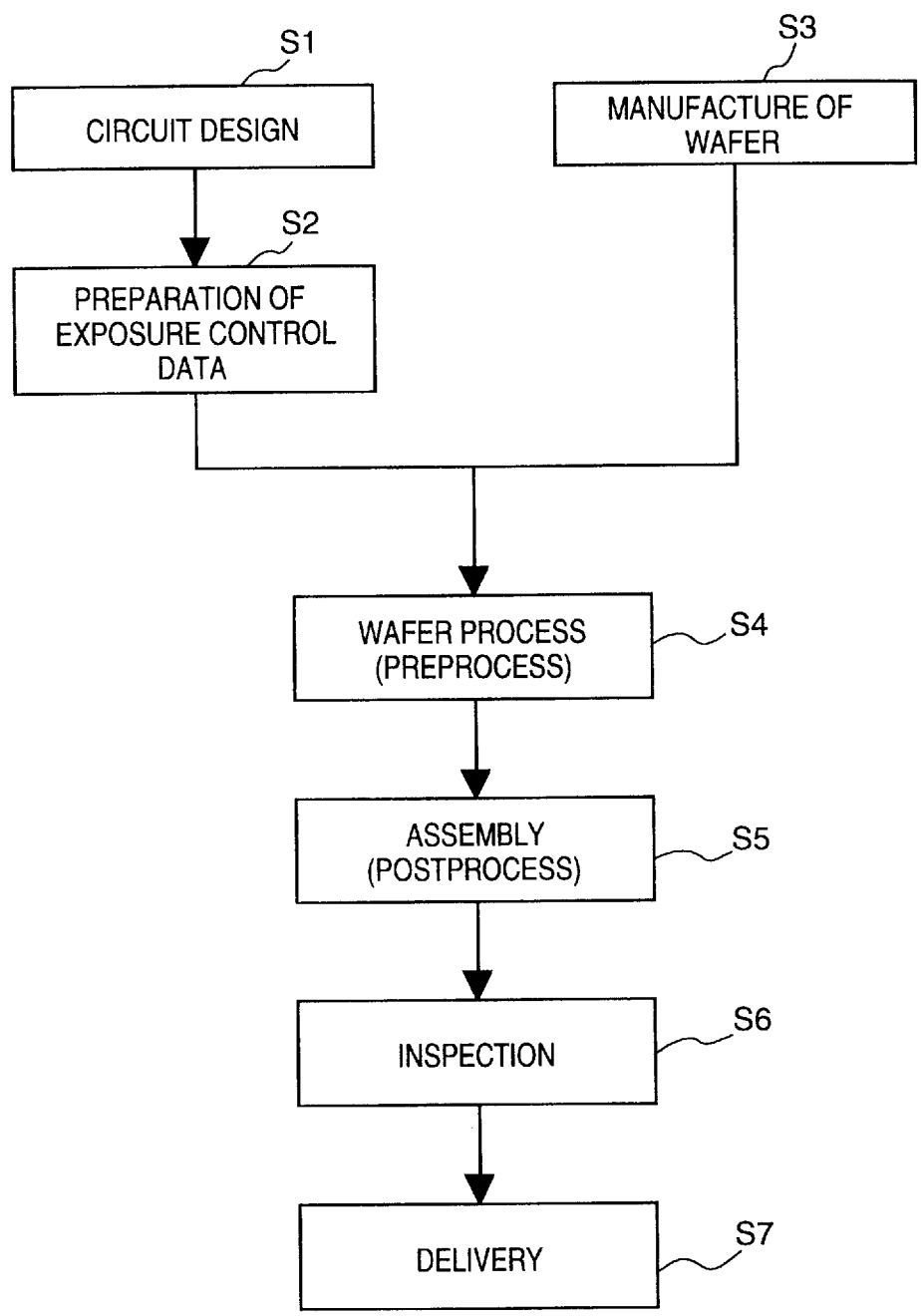
FIG. 13 is a flowchart for describing the manufacture of a microdevice.

FIG. 13 is a flowchart illustrating the manufacture of a microdevice (e.g., a semiconductor chip such as an IC or an LSI chip, a liquid crystal panel, a CCD, a thin-film magnetic head, a micromachine, etc.). The circuit of the semiconductor device is designed at step 1 (circuit design). Exposure control data for the exposure apparatus is created based upon the design circuit pattern at step 2 (preparation of exposure control data). A wafer is manufactured using a material such as silicon at step 3 (manufacture of wafer). At step 4 (wafer process), which is referred to as a preprocess, an actual circuit is formed on the wafer by lithography using the wafer and the exposure apparatus in which the prepared exposure control data has been entered. At step 5 (assembly), which is referred to as a postprocess, semiconductor chips are formed from the wafer fabricated at step 4. This postprocess includes an assembly process (dicing and bonding) and a packaging process (chip encapsulation). The semiconductor device fabricated at step 5 is subjected to inspections such as a test for confirmation of operation and a test of durability at step 6 (inspection). These steps are executed to complete the manufacture of the semiconductor device, which is delivered at step 7.

Figure 14:
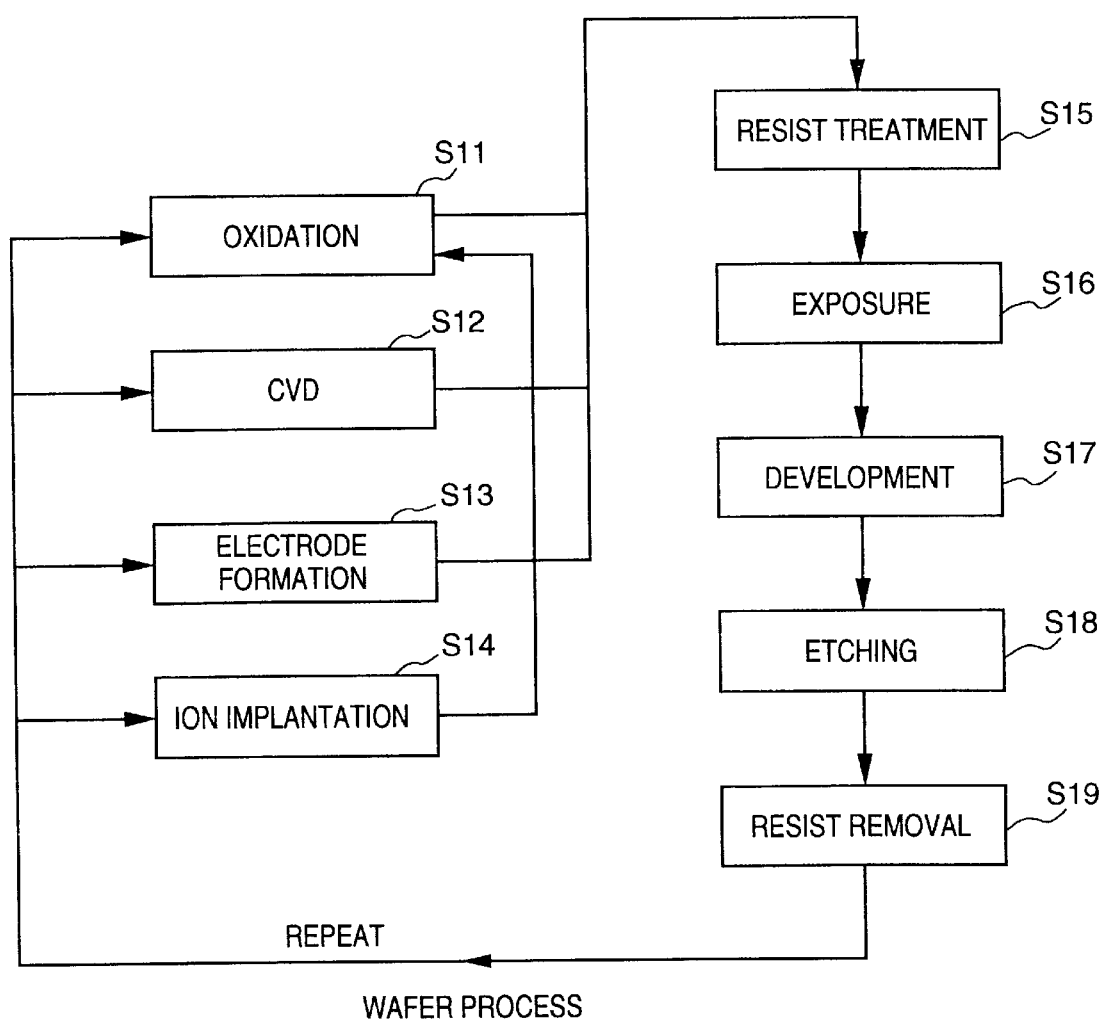
FIG. 14 is a flowchart for describing a wafer process.
Figure 15:
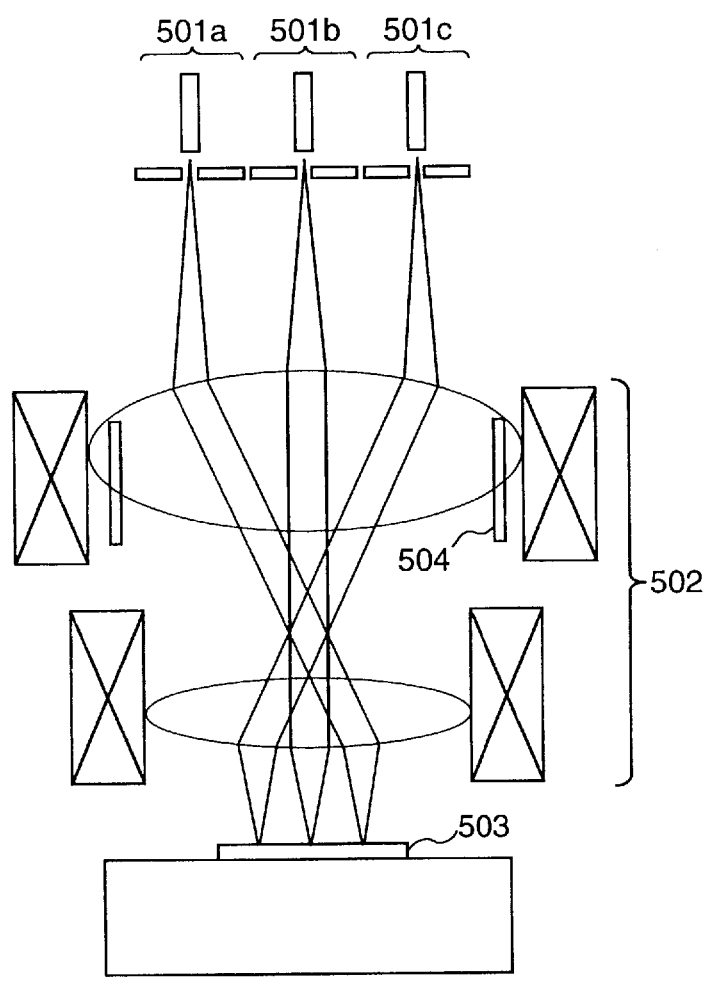
FIG. 15 is a diagram for describing a multi-beam electron beam exposure apparatus according to the prior art.

FIG. 14 is a flowchart showing the wafer process in detail. The surface of the wafer is oxidized at step 11 (oxidation) and an insulating film is formed on the wafer surface at step 12 (CVD). An electrode is formed on the wafer by vapor deposition at step 13 (electrode formation), and ions are implanted in the wafer at step 14 (ion implantation). The wafer is coated with a photosensitive agent at step 15 (resist treatment). The circuit pattern is printed on the wafer by exposure at step 16 (exposure) using the exposure apparatus described above. The exposed wafer is developed at step 17 (development) and portions of the wafer other than those having the developed resist image are etched away at step 18 (etching). The unnecessary resist left after etching is removed at step 19 (resist removal). Repeating these steps forms multiple circuit patterns on the wafer.

If the method of manufacture according to this embodiment is used, a semiconductor device having a high degree of integration, which is difficult to manufacture conventionally, can be manufactured at low cost.

In accordance with the present invention, as described above, a beam coordinate system (Xa, Ya) decided by a plurality of beam reference positions and a deflection coordinate system (Xd, Yd) decided by a deflector in a multi-electron beam exposure apparatus can be made to coincide in a highly precise fashion and exposure can be performed upon rapidly correcting a change in the offset between the two coordinate systems with the passage of time.

The present invention is not limited to the above embodiments and various changes and modifications can be made within the spirit and scope of the present invention. Therefore, to apprise the public of the scope of the present invention, the following claims are made.

What is claimed is:

1. An electron beam exposure apparatus having irradiating means for causing a plurality of electron beams to be arrayed on and to irradiate a substrate, deflecting means for deflecting the plurality of electron beams, which are caused to irradiate the substrate by said irradiating means, by approximately identical amounts of deviation, and driving means for driving a stage on which the substrate is placed, said apparatus comprising:

detecting means for detecting irradiation positions of the electron beams which irradiate the stage;

first correcting means for establishing coincidence between a design coordinate system and a beam coordinate system, which is decided by the array of the plurality of electron beams caused to irradiate the stage under substantially identical conditions by said irradiating means, based upon a relationship between electron beam irradiation positions detected by said detecting means and design irradiation positions; and second correcting means for establishing coincidence between a deflection coordinate system associated with said deflecting means and the design coordinate system based upon a relationship between the design irradiation positions and the electron beam irradiation positions detected by said detecting means when the electron beams are deflected by said deflecting means.

2. The apparatus according to claim 1, wherein said first correcting means corrects a setting for controlling the stage driving means.

3. The apparatus according to claim 2, wherein said first correcting means obtains an amount of translation and an amount of rotation between the beam coordinate system and the design coordinate system that are necessary to establish coincidence between the beam coordinate system and the design coordinate system, and corrects the setting for controlling the stage driving means.

4. The apparatus according to claim 1, wherein said irradiating means has a plurality of electron beam sources and an electron optical system for projecting a plurality of electron beams, which have been emitted by respective ones of said electron beam sources, onto the substrate, said first correcting means obtaining an amount of linear expansion and contraction necessary to establish coincidence between the beam coordinate system and the design coordinate system, and sets a magnification of said electron optical system based upon said amount.

5. The apparatus according to claim 4, wherein said irradiating means further has a rotating lens for producing rotational aberration in the plurality of electron beams which irradiate the substrate from said plurality of electron beam sources, said first correcting means obtaining an amount of rotation between the beam coordinate system and the design Coordinate system that is necessary to establish coincidence between the beam coordinate system and the design coordinate system, and correcting a setting, which is for controlling said rotating lens, based upon said amount of rotation.

6. The apparatus according to claim 1, wherein said second correcting means executes processing for establishing coincidence between the deflection coordinate system and the design coordinate system after said first correcting means has established coincidence between the beam coordinate system and the design coordinate system.

7. The apparatus according to claim 1, wherein said second correcting means establishes coincidence between the deflection coordinate system and the design coordinate system based upon a relationship between the beam coordinate system and the design coordinate system in addition to the relationship between the design irradiation positions and the electron beam irradiation positions detected by said detecting means when the plurality of electron beams are deflected by said deflecting means.

8. The apparatus according to claim 7, wherein said second correcting means corrects a setting, which is for controlling said deflecting means, in such a manner that coincidence is established between the beam coordinate system and the deflection coordinate system, based upon an amount of rotation between the beam coordinate system and the design coordinate system that is necessary to establish coincidence between the beam coordinate system and the design coordinate system, and an amount of rotation between the deflection coordinate system and the design coordinate system that is necessary to establish coincidence between the deflection coordinate system and the design coordinate system.

9. The apparatus according to claim 1, wherein said irradiating means has a plurality of electron beam sources, at least four of said electron beam sources being used when the beam coordinate system and the design coordinate system are made to coincide by said first correcting means.

10. The apparatus according to claim 1, wherein said irradiating means has a plurality of electron beam sources, at least one of said electron beam sources being used when the deflection coordinate system and the design coordinate system are made to coincide by said second correcting means, said deflecting means being controlled in such a manner that irradiation positions of the electron beam from this electron beam source are at least three locations, and the deflection coordinate system and design coordinate system being made to coincide based upon irradiation positions of the electron beams, at the at least three locations, detected by said detecting means.

11. A method of manufacturing a device using the apparatus described in claim 1.

12. An electron beam exposure apparatus having irradiating means that includes a plurality of electron beam sources, wherein a plurality of electron beams emitted by respective ones of said plurality of electron beam sources are arrayed on and irradiate a substrate, deflecting means for deflecting the plurality of electron beams, which are caused to irradiate the substrate by said irradiating means, by approximately identical amounts of deviation, and driving means for driving a stage on which the substrate is placed, said apparatus comprising:

detecting means for detecting irradiation positions of the electron beams which irradiate the stage;

first correcting means for establishing coincidence between a design coordinate system and a deflection coordinate system, which is associated with said deflecting means,. based upon a relationship between design irradiation positions and the electron beam irradiation positions detected by said detecting means when a first number of said electron beam sources is used and electron beams which irradiate the stage from each of these electron beam sources are deflected by said deflecting means;

calculating means which, after coincidence has been established between the deflection coordinate system and the design coordinate system by said first correcting means, is for calculating parameters which indicate the relationship between the design irradiation positions and the electron beam irradiation positions detected by said detecting means when a second number of said electron beam sources, which is less than said first number, is used and electron beams which irradiate the stage from each of these electron beam sources are deflected by said deflecting means; and second correcting means for correcting an offset between the deflection coordinate system and the design coordinate system based upon a change in a parameter calculated by said calculating means at different times.

13. The apparatus according to claim 12, further comprising third correcting means for establishing coincidence between a design coordinate system and a beam coordinate system, which is decided by an array of irradiation positions of the plurality of electron beams caused to irradiate the stage under substantially identical conditions by said irradiating means, based upon a relationship between electron beam irradiation positions detected by said detecting means and design irradiation positions, wherein said second correcting means executes calculation of parameters after the deflection coordinate system, beam coordinate system and design coordinate system have been made to coincide by said first and third correcting means.

14. The apparatus according to claim 12, wherein the parameters include coefficients which indicate an amount of rotation and an amount of linear expansion and contraction between the deflection coordinate system and the design coordinate system.

15. The apparatus according to claim 12, wherein the second number is one.

16. The apparatus according to claim 12, wherein said calculating means calculates the parameter after the deflection coordinate system and the design coordinate system have been made to coincide by said first correcting means, adopts this parameter as a first parameter, calculates a parameter immediately before a pattern is drawn on the substrate and adopts this parameter as a second parameter, and said second correcting means corrects an offset between the deflection coordinate system and the design coordinate system based upon a difference between the first and second parameters.

17. A method of manufacturing a device using the apparatus described in claim 12.

18. A method of controlling an electron beam exposure apparatus having irradiating means for causing a plurality of electron beams to be arrayed on and to irradiate a substrate, deflecting means for deflecting the plurality of electron beams, which are caused to irradiate the substrate by said irradiating means, by approximately identical amounts of deviation, driving means for driving a stage on which the substrate is placed, and detecting means for detecting irradiation positions of the electron beams which irradiate the stage, said method comprising:

a first correcting step of establishing coincidence between a design coordinate system and a beam coordinate system, which is decided by the array of the plurality of electron beams caused to irradiate the stage under substantially identical conditions by said irradiating means, based upon a relationship between electron beam irradiation positions detected by said detecting means and design irradiation positions; and a second correcting step of establishing coincidence between a deflection coordinate system associated with said deflecting means and the design coordinate system based upon a relationship between the design irradiation positions and the electron beam irradiation positions detected by said detecting means when the electron beams are deflected by said deflecting means.

19. The method according to claim 18, wherein a setting for controlling the stage driving means is corrected at said first correcting step.

20. The method according to claim 19, wherein an amount of translation and an amount of rotation between the beam coordinate system and the design coordinate system that are necessary to establish coincidence between the beam coordinate system and the design coordinate system are obtained and the setting for controlling the stage driving means is corrected based upon the amount of translation and the amount of rotation.

21. The method according to claim 18, wherein said irradiating means has a plurality of electron beam sources and an electron optical system for projecting a plurality of electron beams, which have been emitted by respective ones of said electron beam sources, onto the substrate, an amount of linear expansion and contraction necessary to establish coincidence between the beam coordinate system and the design coordinate system being obtained and magnification of said electron optical system being set based upon said amount at said first correcting step.

22. The method according to claim 21, wherein said irradiating means further has a rotating lens for producing rotational aberration in the plurality of electron beams which irradiate the substrate from said plurality of electron beam sources, an amount of rotation between the beam coordinate system and the design coordinate system that is necessary to establish coincidence between the beam coordinate system and the design coordinate system being obtained and a setting, which is for controlling said rotating lens, being corrected based upon said amount of rotation at said first correcting step.

23. The method according to claim 18, wherein coincidence between the deflection coordinate system and the design coordinate system is established at said second correcting step after coincidence between the beam coordinate system and the design coordinate system is established at said first correcting step.

24. The method according to claim 18, wherein coincidence between the deflection coordinate system and the design coordinate system is established at said second correcting step based upon a relationship between the beam coordinate system and the design coordinate system in addition to the relationship between the design irradiation positions and the electron beam irradiation positions detected by said detecting means when the plurality of electron beams are deflected by said deflecting means.

25. The method according to claim 24, wherein a setting, which is for controlling said deflecting means, is corrected at said second correcting step in such a manner that coincidence is established between the beam coordinate system and the deflection coordinate system, based upon an amount of rotation between the beam coordinate system and the design coordinate system that is necessary to establish coincidence between the beam coordinate system and the design coordinate system, and an amount of rotation between the deflection coordinate system and the design coordinate system that is necessary to establish coincidence between the deflection coordinate system and the design coordinate system.

26. The method according to claim 18, wherein said irradiating means has a plurality of electron beam sources, at least four of said electron beam sources being used when the beam coordinate system and the design coordinate system are made to coincide at said first correcting step.

27. The method according to claim 18, wherein said irradiating means has a plurality of electron beam sources, at least one of said electron beam sources being used when the deflection coordinate system and the design coordinate system are made to coincide by said second correcting means, said deflecting means being controlled in such a manner that irradiation positions of the electron beam from this electron beam source are at least three locations, and the deflection coordinate system and design coordinate system being made to coincide based upon irradiation positions of the electron beams, at the at least three locations, detected by said detecting means.

28. A method of manufacturing a device using the electron beam exposure apparatus while controlling said electron beam exposure apparatus by the method of control described in claim 18.

29. A method of controlling an electron beam exposure apparatus having irradiating means that includes a plurality of electron beam sources, wherein a plurality of electron beams emitted by respective ones of said plurality of electron beam sources are arrayed on and irradiate a substrate, deflecting means for deflecting the plurality of electron beams, which are caused to irradiate the substrate by said irradiating means, by approximately identical amounts of deviation, driving means for driving a stage on which the substrate is placed, and detecting means for detecting irradiation positions of the electron beams which irradiate the stage, said method comprising:

- a first correcting step of establishing coincidence between a design coordinate system and a deflection coordinate system, which is associated with said deflecting means, based upon a relationship between design irradiation positions and the electron beam irradiation positions detected by said detecting means when a first number of said electron beam sources is used and electron beams which irradiate the stage from each of these electron beam sources are deflected by said deflecting means;
- a calculating step which, after coincidence has been established between the deflection coordinate system and the design coordinate system by said first correcting means, is a step of calculating parameters which indicate the relationship between the design irradiation positions and the electron beam irradiation positions detected by said detecting means when a second number of said electron beam sources, which is less than said first number, is used and electron beams which irradiate the stage from each of these electron beam sources are deflected by said deflecting means; and
- a second correcting step of correcting an offset between the deflection coordinate system and the design coordinate system based upon a change in a parameter calculated at said calculating step at different times.

30. The method according to claim 29, further comprising a third correcting step of establishing coincidence between a design coordinate system and a beam coordinate system, which is decided by an array of irradiation positions of the plurality of electron beams caused to irradiate the stage under substantially identical conditions by said irradiating means, based upon a relationship between electron beam irradiation positions detected by said detecting means and the design irradiation positions, wherein said third correcting step is executed before said first correcting step.

31. The method according to claim 29, wherein the parameters include coefficients which indicate an amount of rotation and an amount of linear expansion and contraction between the deflection coordinate system and the design coordinate system.

32. The method according to claim 29, wherein the second number is one.

33. The method according to claim 29, wherein said calculating step calculates the parameter after the deflection coordinate system and the design coordinate system have been made to coincide at said first correcting step, adopts this parameter as a first parameter, calculates a parameter immediately before a pattern is drawn on the substrate and adopts this parameter as a second parameter, and said second correcting means corrects an offset between the deflection coordinate system and the design coordinate system based upon a difference between the first and second parameters.

34. A method of manufacturing a device using the electron beam exposure apparatus while controlling said electron beam exposure apparatus by the method of control described in claim 29.

35. A computer readable program for controlling an electron beam exposure apparatus having irradiating means for causing a plurality of electron beams to be arrayed on and to irradiate a substrate, deflecting means for deflecting the plurality of electron beams, which are caused to irradiate the substrate by said irradiating means, by approximately identical amounts of deviation, driving means for driving a stage on which the substrate is placed, and detecting means for detecting irradiation positions of the electron beams which irradiate the stage, said program comprising:

- a first correcting step of establishing coincidence between a design coordinate system and a beam coordinate system, which is decided by the array of the plurality of electron beams caused to irradiate the stage under substantially identical conditions by said irradiating means, based upon a relationship between electron beam irradiation positions detected by said detecting means and design irradiation positions; and
- a second correcting step of establishing coincidence between a deflection coordinate system associated with said deflecting means and the design coordinate system based upon a relationship between the design irradiation positions and the electron beam irradiation positions detected by said detecting means when the electron beams are deflected by said deflecting means.

36. A computer readable program for controlling an electron beam exposure apparatus having irradiating means that includes a plurality of electron beam sources, wherein a plurality of electron beams emitted by respective ones of said plurality of electron beam sources are arrayed on and irradiate a substrate, deflecting means for deflecting the plurality of electron beams, which are caused to irradiate the substrate by said irradiating means, by approximately identical amounts of deviation, driving means for driving a stage on which the substrate is placed, and detecting means for detecting irradiation positions of the electron beams which irradiate the stage, said program comprising:

- a first correcting step of establishing coincidence between a design coordinate system and a deflection coordinate system, which is associated with said deflecting means, based upon a relationship between design irradiation positions and the electron beam irradiation positions detected by said detecting means when a first number of said electron beam sources is used and electron beams which irradiate the stage from each of these electron beam sources are deflected by said deflecting means;
- a calculating step which, after coincidence has been established between the deflection coordinate system and the design coordinate system by said first correcting means, is a step of calculating parameters which indicate the relationship between the design irradiation positions and the electron beam irradiation positions detected by said detecting means when a second number of said electron beam sources, which is less than said first number, is used and electron beams which irradiate the stage from each of these electron beam sources are deflected by said deflecting means; and
- a second correcting step of correcting an offset between the deflection coordinate system and the design coordinate system based upon a change in a parameter calculated at said calculating step at different times.

\* \* \* \* \*

UNITED STATES PATENT AND TRADEMARK OFFICE
CERTIFICATE OF CORRECTION

Page 1 of 3

PATENT NO. : 5,864,142

DATED : January 26, 1999

INVENTORS : MASATO MURAKI, ET AL.

It is certified that error appears in the above-identified patent and that said Letters Patent is hereby corrected as shown below:

COLUMN 1:

line 19, "through" should read --through the--.

COLUMN 2:

line 11, "through" should read --though--.

COLUMN 3:

line 65, "A" should read --a--.

COLUMN 8:

line 22, "Ax" should read --AX--.

COLUMN 11:

line 54, "the" should be deleted.

COLUMN 13:

line 8, "system; and" should read --system.--.

UNITED STATES PATENT AND TRADEMARK OFFICE
CERTIFICATE OF CORRECTION

PATENT NO. : 5,864,142

DATED : January 26, 1999

INVENTORS : MASATO MURAKI, ET AL.

It is certified that error appears in the above-identified patent and that said Letters Patent is hereby corrected as shown below:

COLUMN 14:

line 13, "and" should read --and the--.

COLUMN 15:

line 8, "(Xs', Ys')" should read --(Xs', Ys'))--.

COLUMN 16:

line 42, "11)" should read --(11)--.

COLUMN 19:

line 37, "Coordinate" should read --coordinate--.

UNITED STATES PATENT AND TRADEMARK OFFICE
CERTIFICATE OF CORRECTION

PATENT NO. : 5,864,142
DATED : January 26, 1999
INVENTOR(S) : MASATO MURAKI, ET AL.

It is certified that error appears in the above-identified patent and that said Letters Patent is hereby corrected as shown below:

Column 20, line 36, "means,." should read --means,--.

Signed and Sealed this

Twenty-first Day of September, 1999

Attest:

Q. TODD DICKINSON

*Attesting Officer*     Acting Commissioner of Patents and Trademarks